US012763747B2

(12) United States Patent
Lim et al.

(10) Patent No.: US 12,763,747 B2
(45) Date of Patent: Oct. 13, 2026

(54) MULTILAYER COMMON MODE FILTER

(71) Applicant: AMOTECH CO., LTD., Incheon (KR)

(72) Inventors: Byungguk Lim, Incheon (KR); Kyuhwan Park, Incheon (KR); Heehwang Kim, Incheon (KR); Tonggi Kim, Incheon (KR)

(73) Assignee: AMOTECH CO., LTD., Incheon (KR)

( * ) Notice: Subject to any disclaimer, the term of this patent is extended or adjusted under 35 U.S.C. 154(b) by 42 days.

(21) Appl. No.: 19/107,099

(22) PCT Filed: Aug. 21, 2023

(86) PCT No.: PCT/KR2023/012322

§ 371 (c)(1),
(2) Date: Feb. 27, 2025

(87) PCT Pub. No.: WO2024/049072

PCT Pub. Date: Mar. 7, 2024

(65) Prior Publication Data

US 2025/0233573 A1 Jul. 17, 2025

(30) Foreign Application Priority Data

Aug. 30, 2022 (KR) ........................ 10-2022-0109050

(51) Int. Cl.
*H01F 17/00* (2006.01)
*H01F 27/29* (2006.01)
(Continued)

(52) U.S. Cl.
CPC ........... *H03H 7/09* (2013.01); *H01F 17/0013* (2013.01); *H01F 27/292* (2013.01); *H03H 7/427* (2013.01);
(Continued)

(58) Field of Classification Search
CPC ........ H03H 7/427; H03H 7/0115; H03H 7/09; H03H 7/01; H03H 2001/0085;
(Continued)

(56) References Cited

U.S. PATENT DOCUMENTS 6,538,531 B2 3/2003 Nosaka et al.
11,264,159 B2 3/2022 Murakami
2019/0164677 A1* 5/2019 Matsuura .............. H01F 27/292

FOREIGN PATENT DOCUMENTS

JP 2001-203552 A 7/2001
JP 2002-043881 A 2/2002
(Continued)

OTHER PUBLICATIONS

KR Office Action dated Nov. 17, 2024 as received in Application No. 10-2022-0109050.
(Continued)

*Primary Examiner* — Stephen E. Jones
(74) *Attorney, Agent, or Firm* — Maschoff Brennan

(57) ABSTRACT

A multilayer common mode filter of the present disclosure is a filter comprising a plurality of coils configuring mutually different channels, wherein a plurality of coil patterns, and a plurality of via conductors connecting the coil patterns are provided inside a coil stack, and the plurality of via conductors are arranged, on a floor plan of the coil stack, in positions where same do not overlap with each other.

19 Claims, 33 Drawing Sheets

(51) Int. Cl.
*H03H 7/09* (2006.01)
*H03H 7/42* (2006.01)

(52) U.S. Cl.
CPC .................. *H01F 2017/002* (2013.01); *H01F 2017/0026* (2013.01)

(58) Field of Classification Search
CPC ........ H03H 2001/0078; H01F 17/0013; H01F 17/0006; H01F 17/00; H01F 17/02; H01F 2017/0093; H01F 2017/002; H01F 2017/0026
USPC .......................................................... 333/185
See application file for complete search history.

(56) References Cited

FOREIGN PATENT DOCUMENTS

| | | | |
|---|---|---|---|
| JP | 2019-102792 | A | 6/2019 |
| JP | 2019-140170 | A | 8/2019 |
| KR | 10-2018-0044812 | A | 5/2018 |
| KR | 10-2020-0033616 | A | 3/2020 |
| KR | 10-2216555 | B1 | 2/2021 |

OTHER PUBLICATIONS

KR Decision to Grant Dated Dec. 5, 2024 as received in Application No. 10-2022-0109050.

* cited by examiner

[FIG. 1]
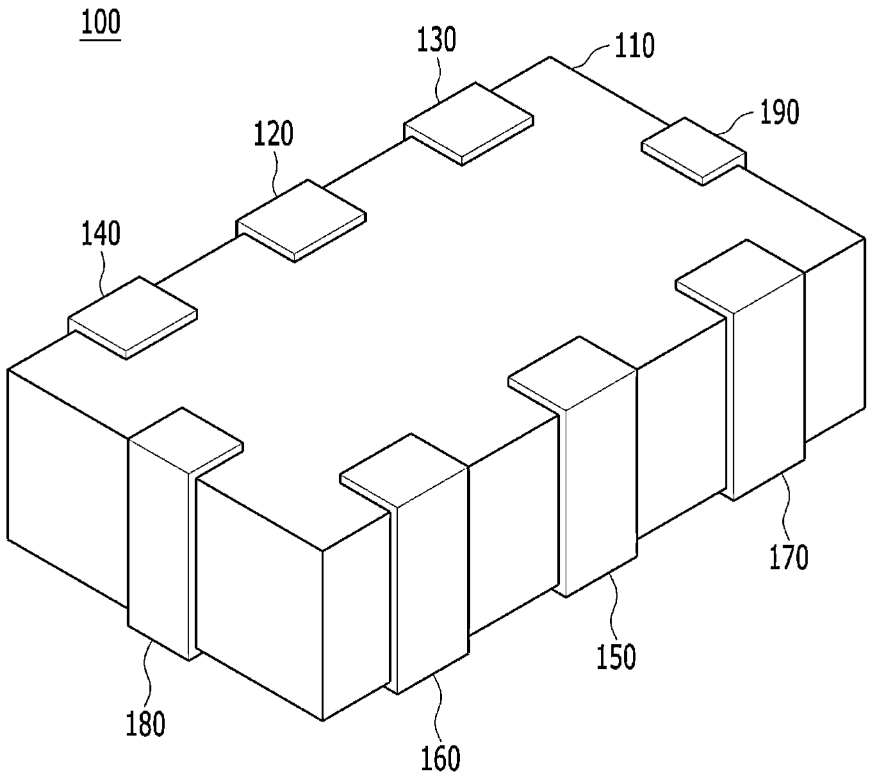

[FIG. 2]
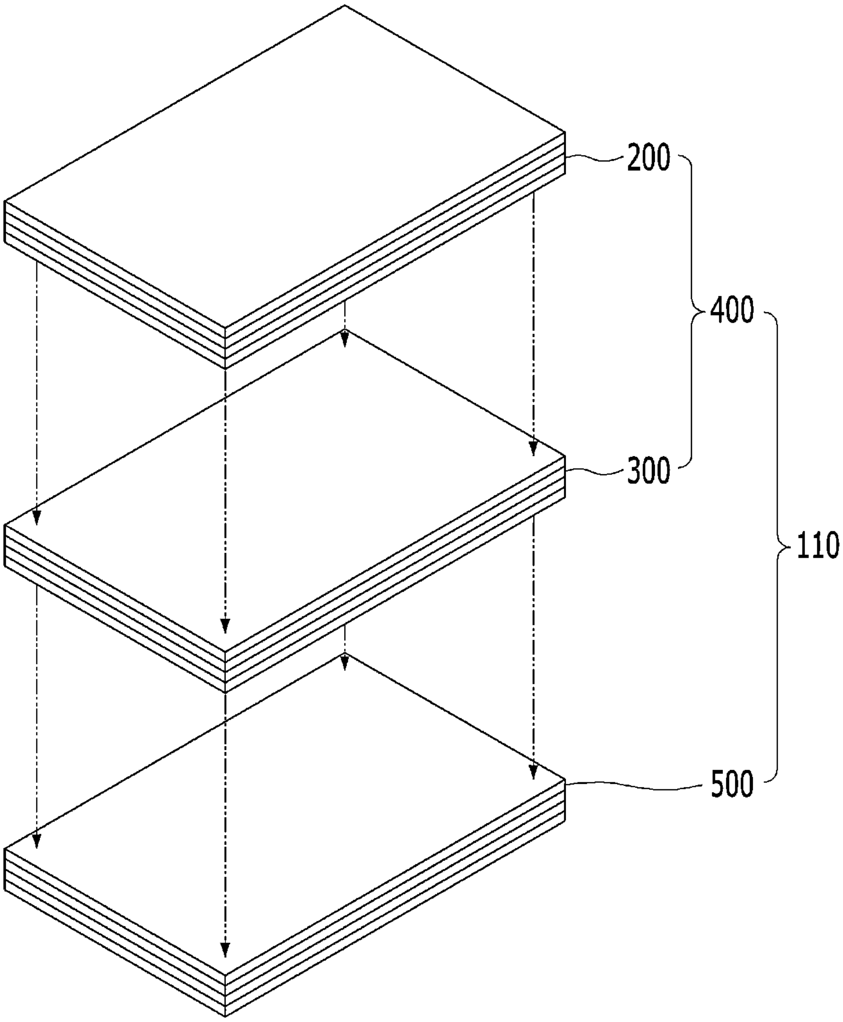

[FIG. 3]
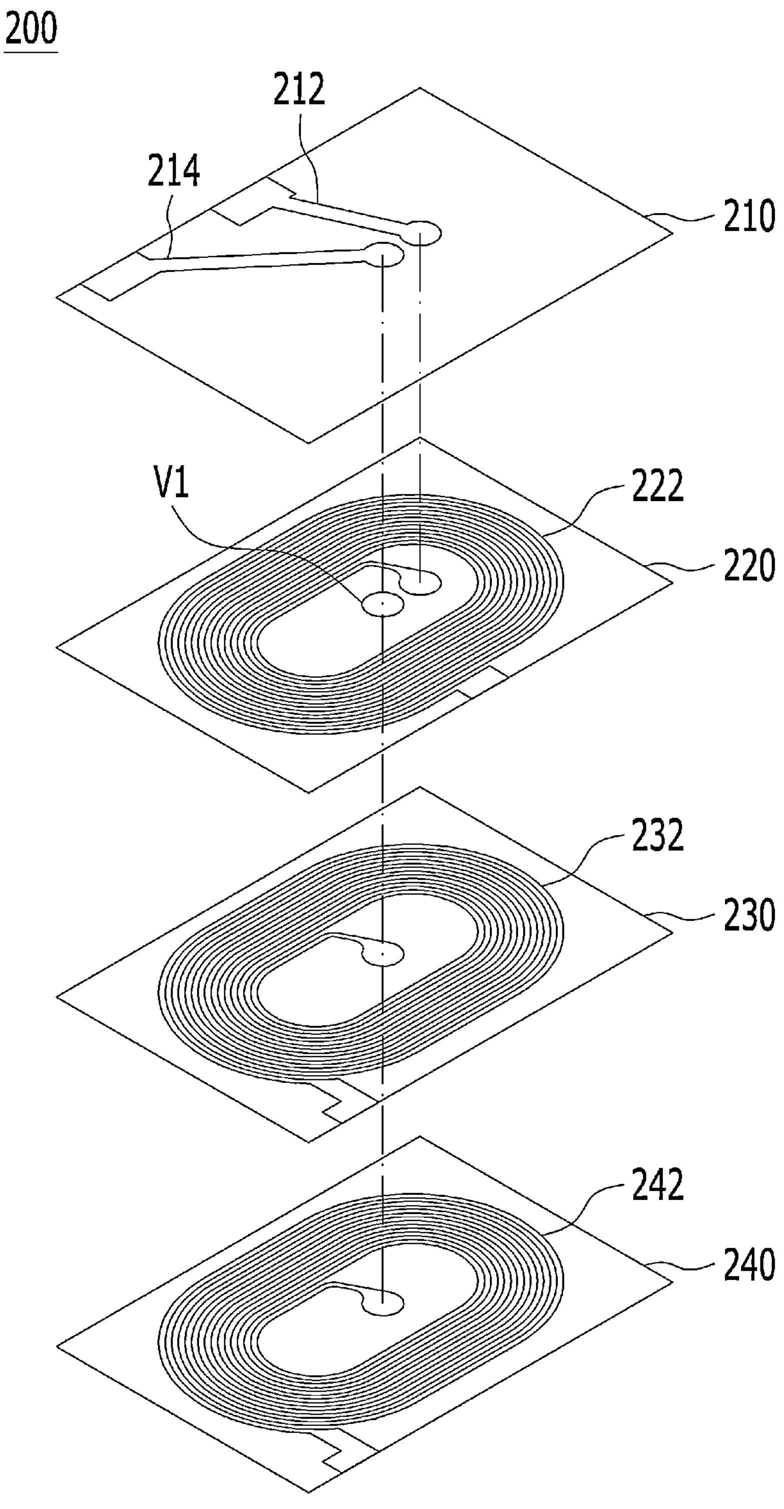

[FIG. 4]
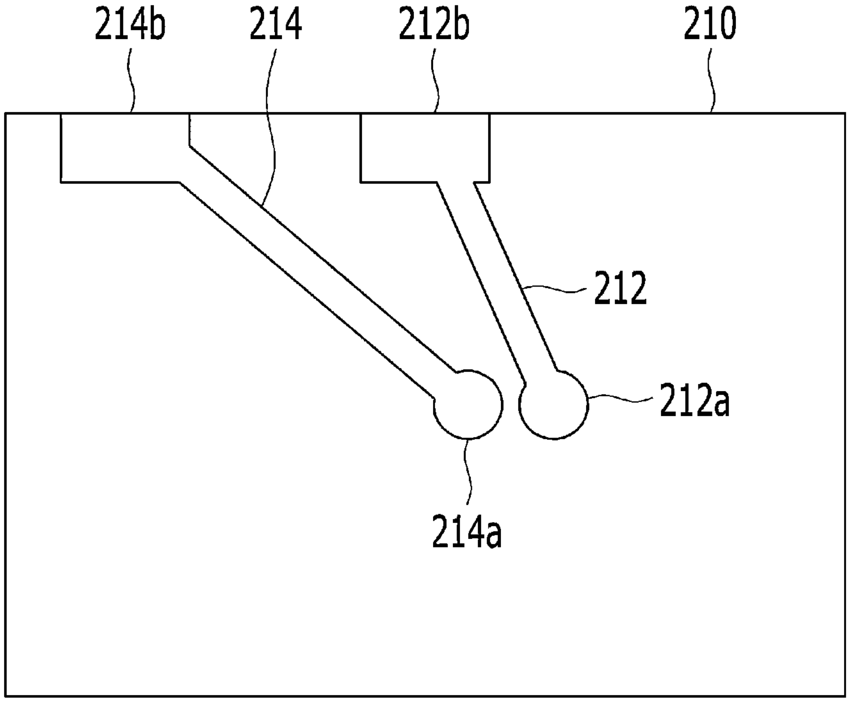

[FIG. 5]
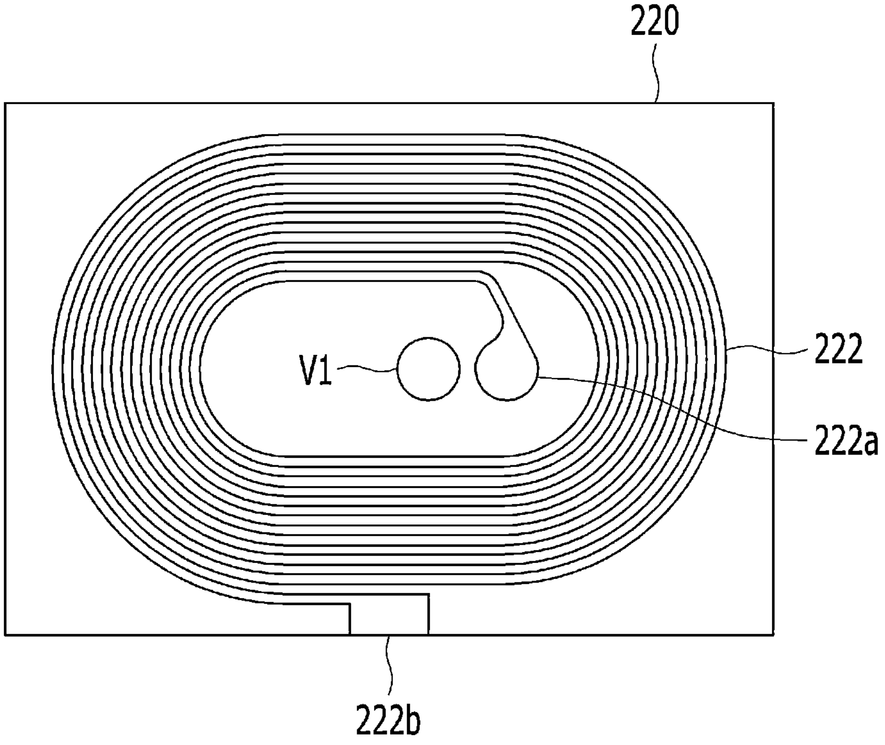

[FIG. 6]
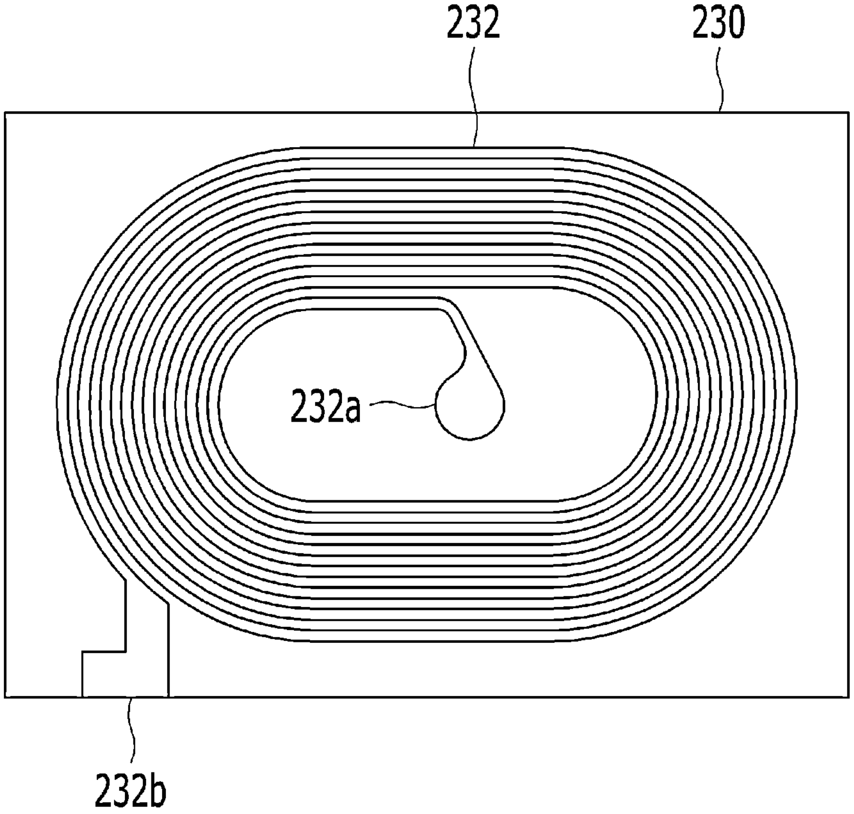

[FIG. 7]
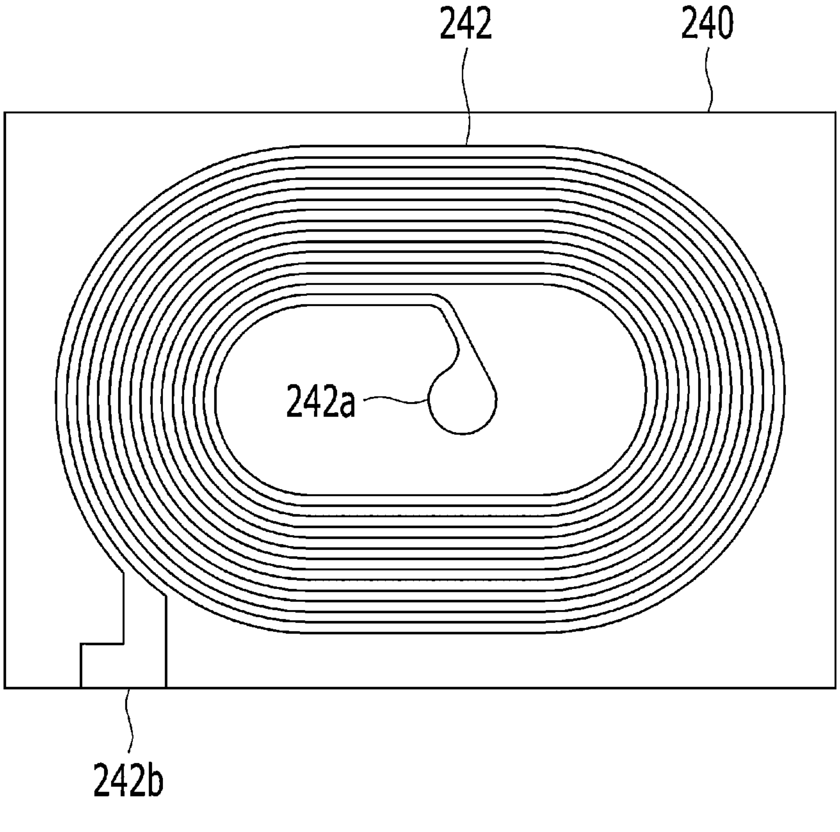

[FIG. 8]
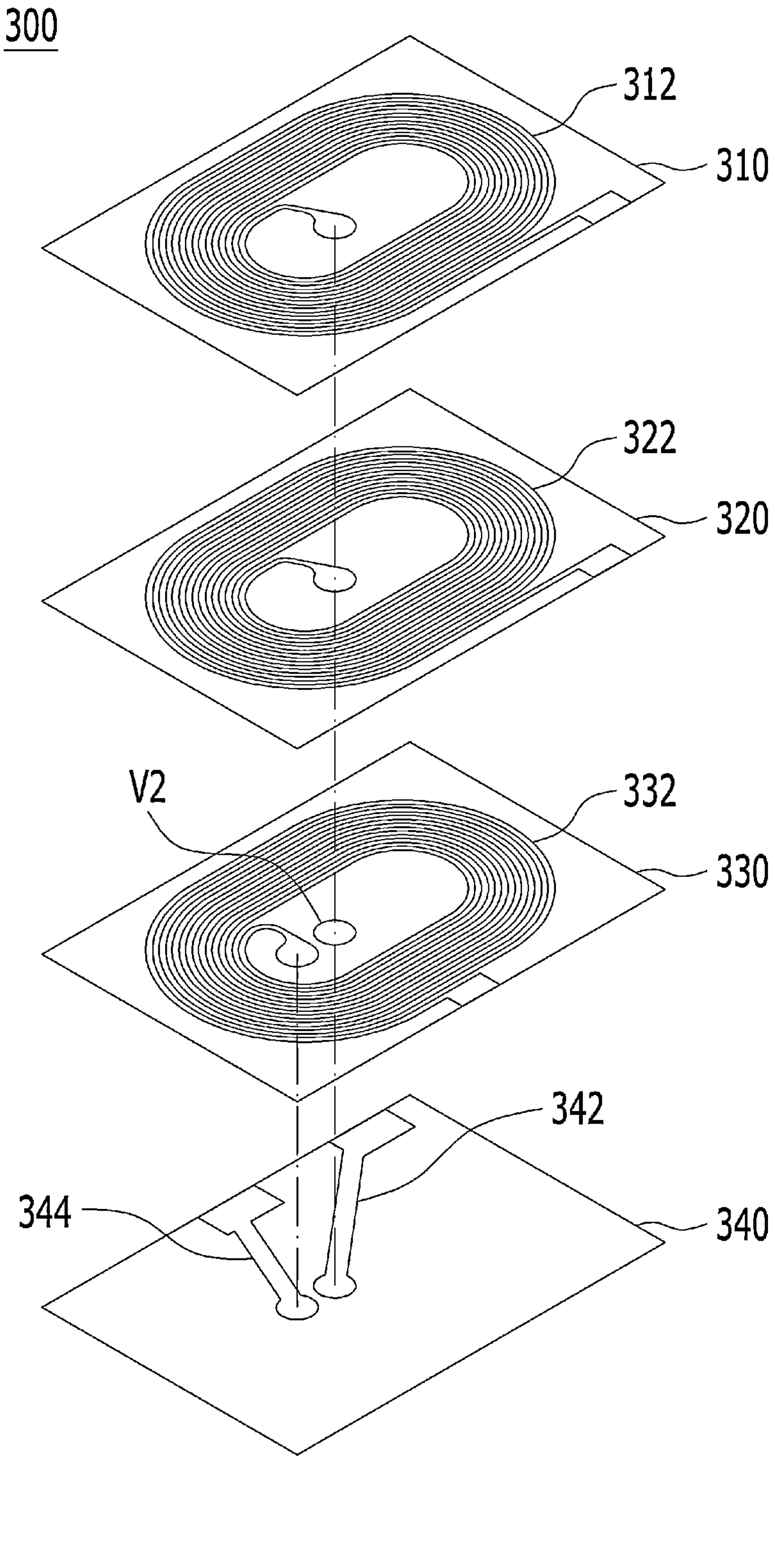

[FIG. 9]
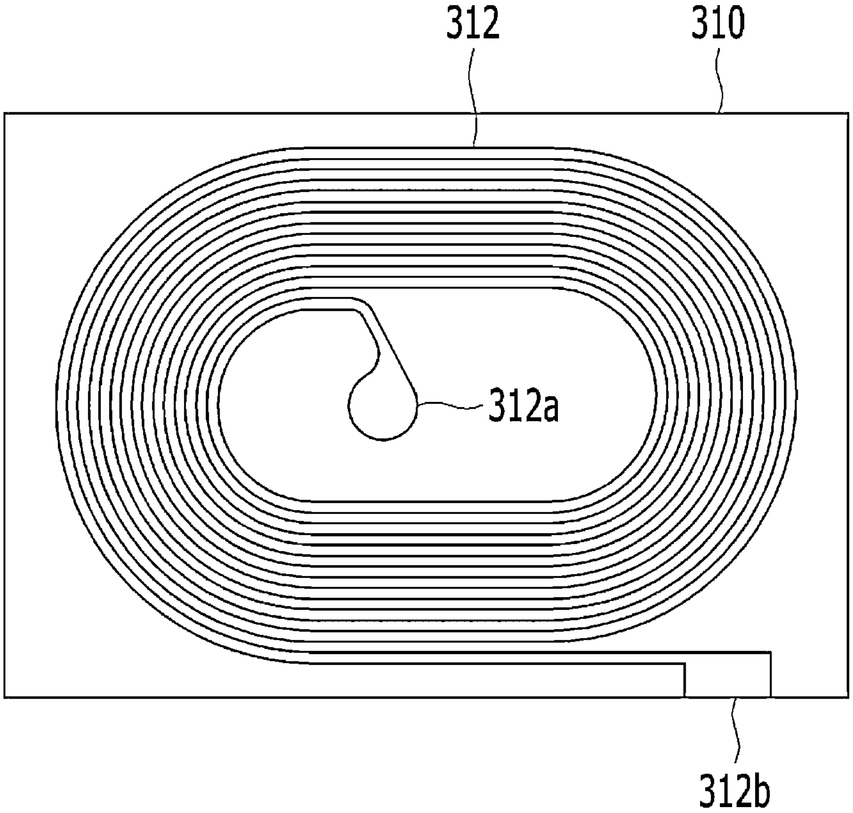

[FIG. 10]
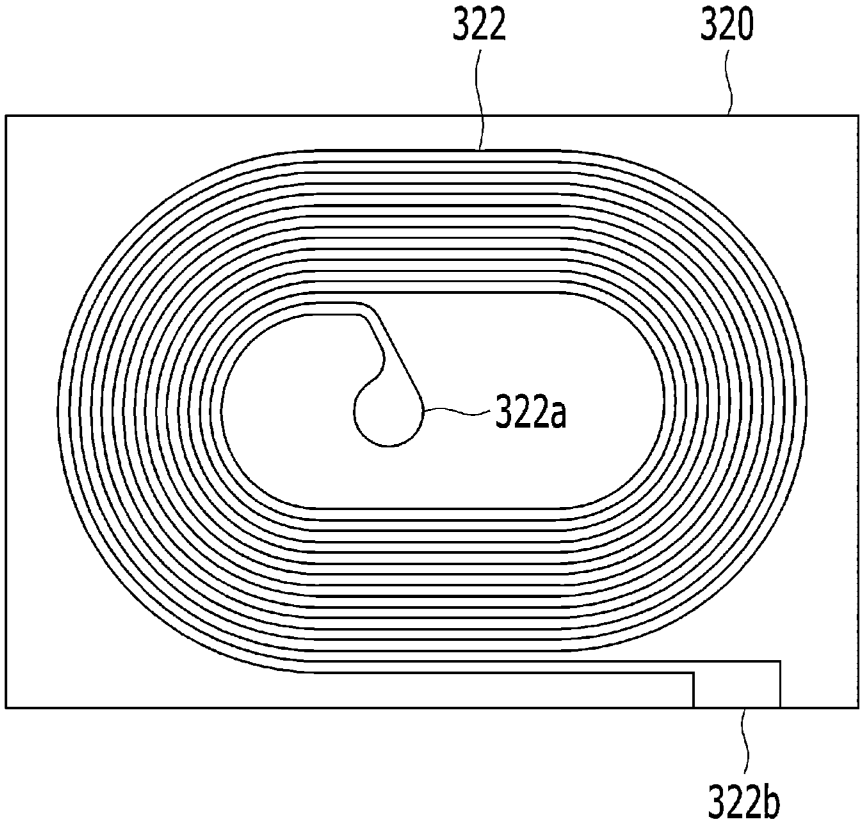

[FIG. 11]
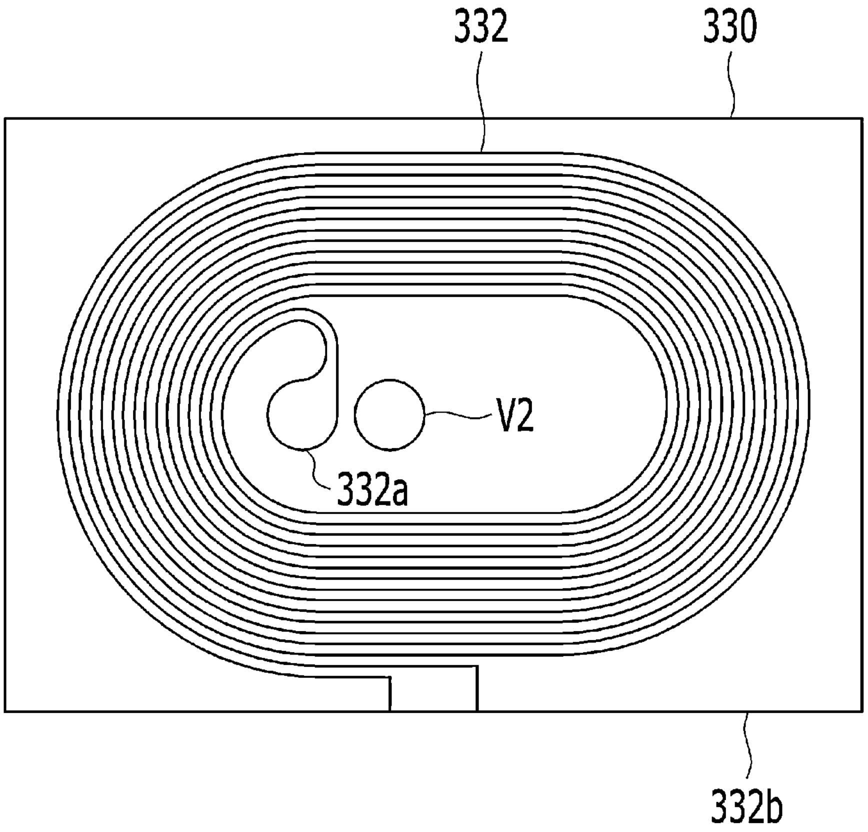

[FIG. 12]
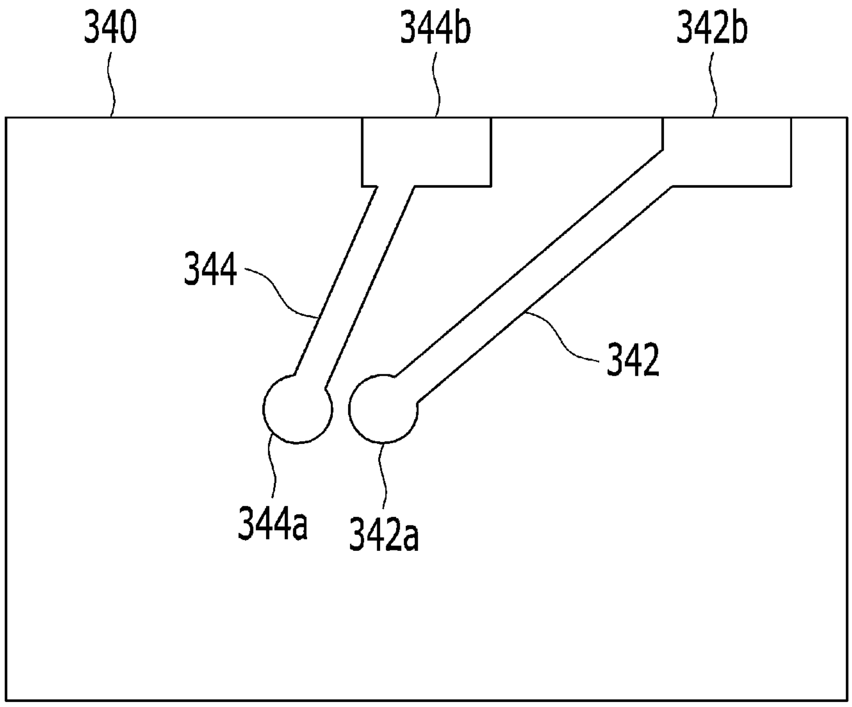

[FIG. 13]
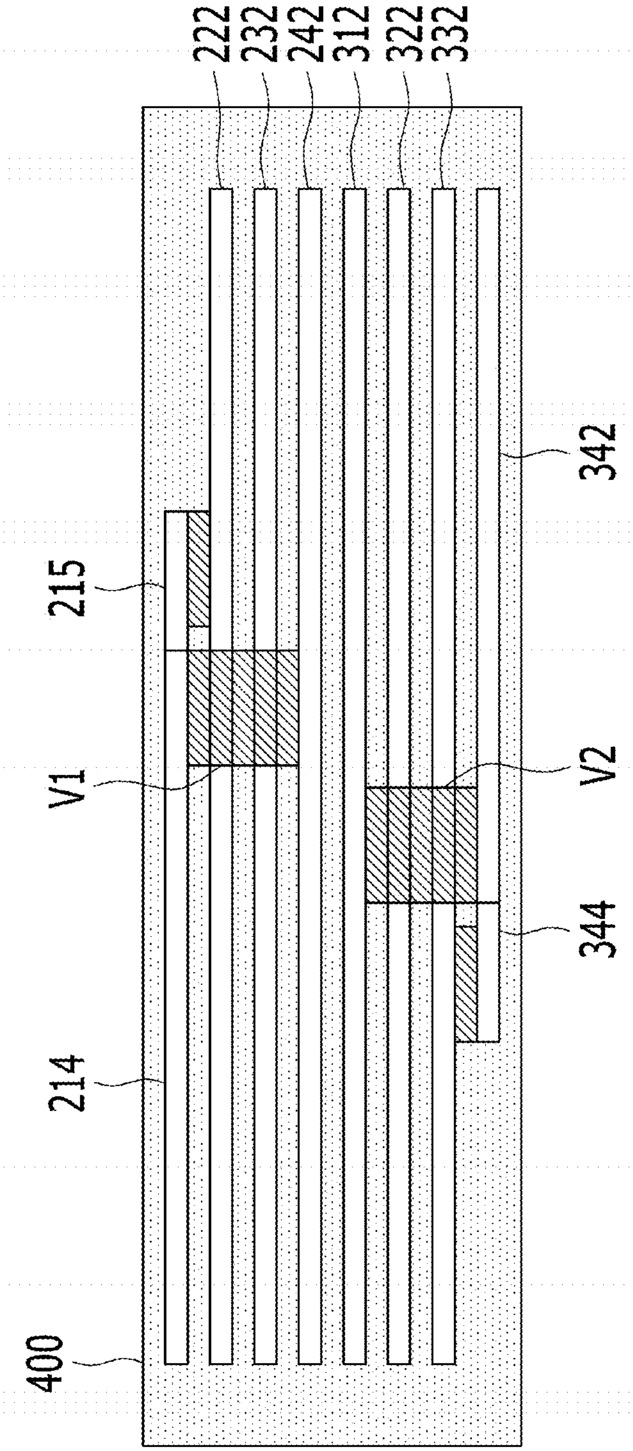

[FIG. 14]
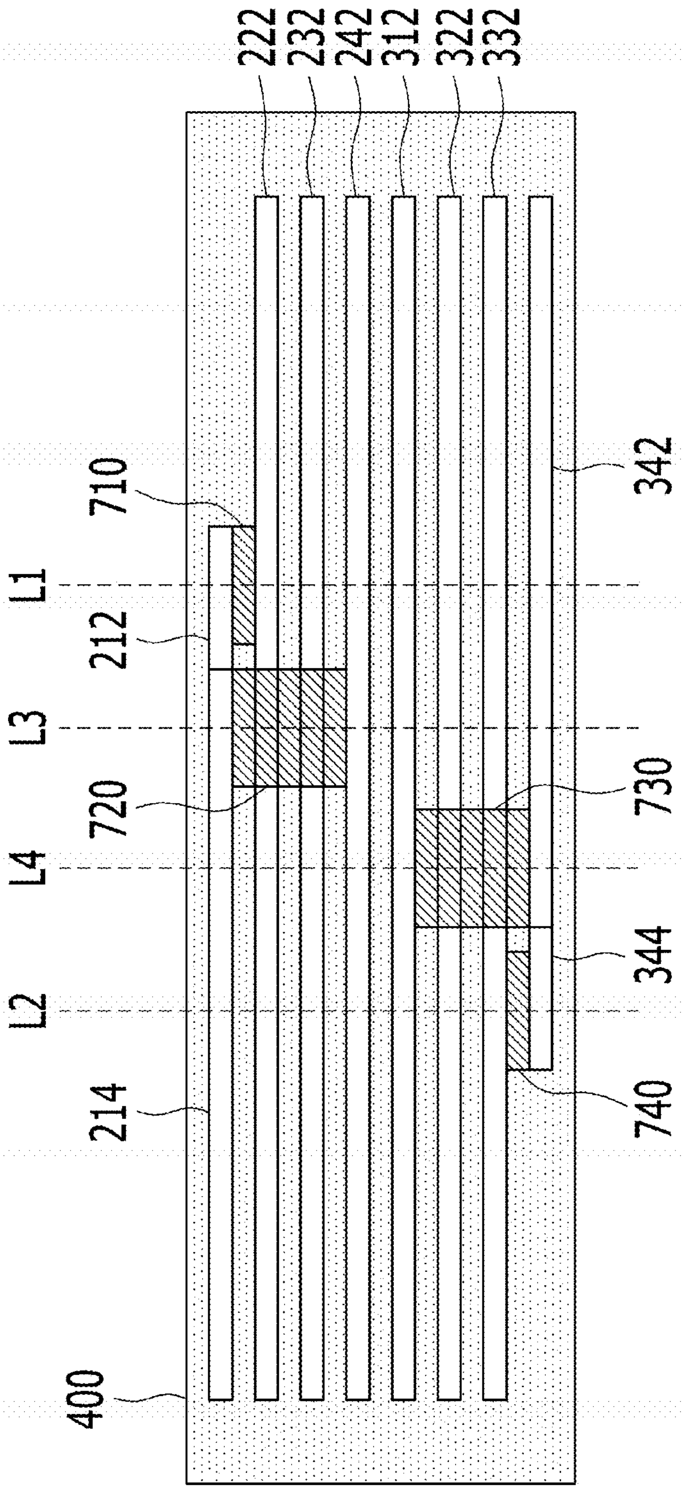

[FIG. 15]
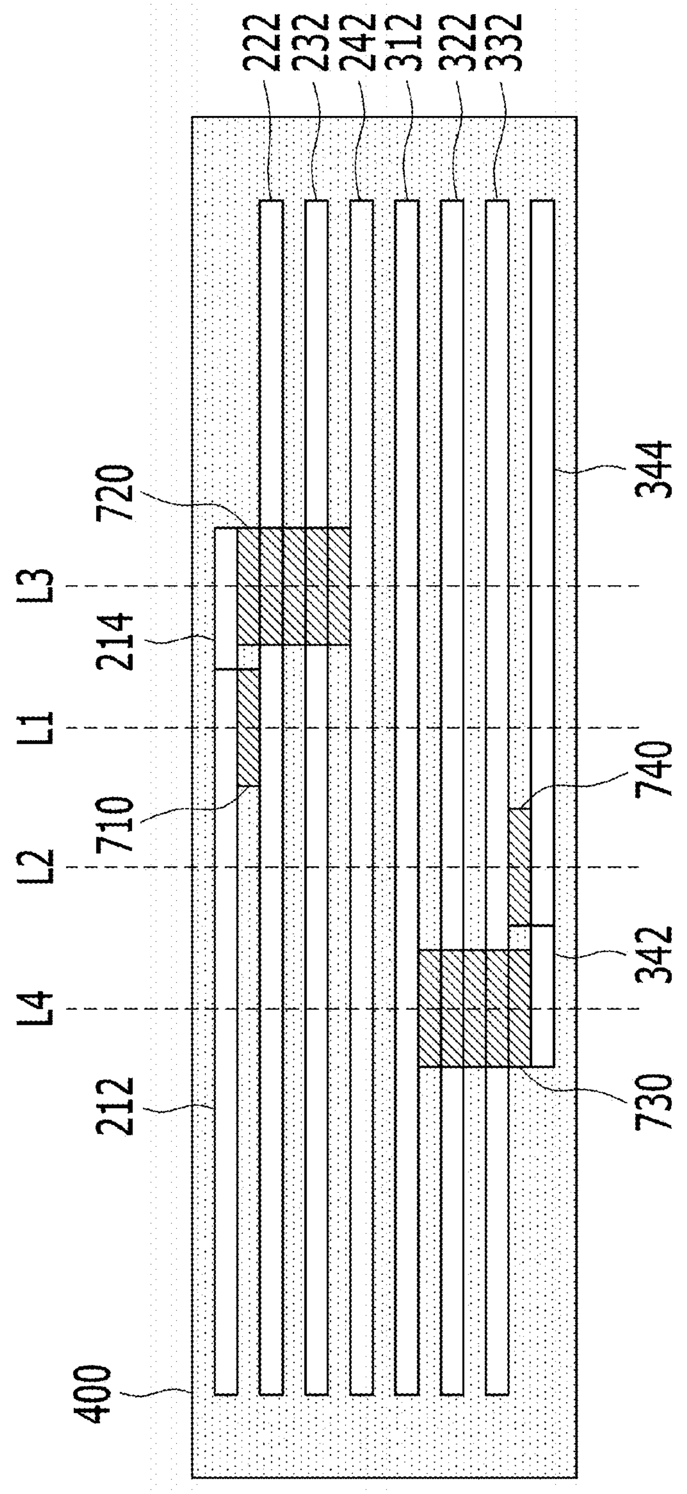

[FIG. 16]
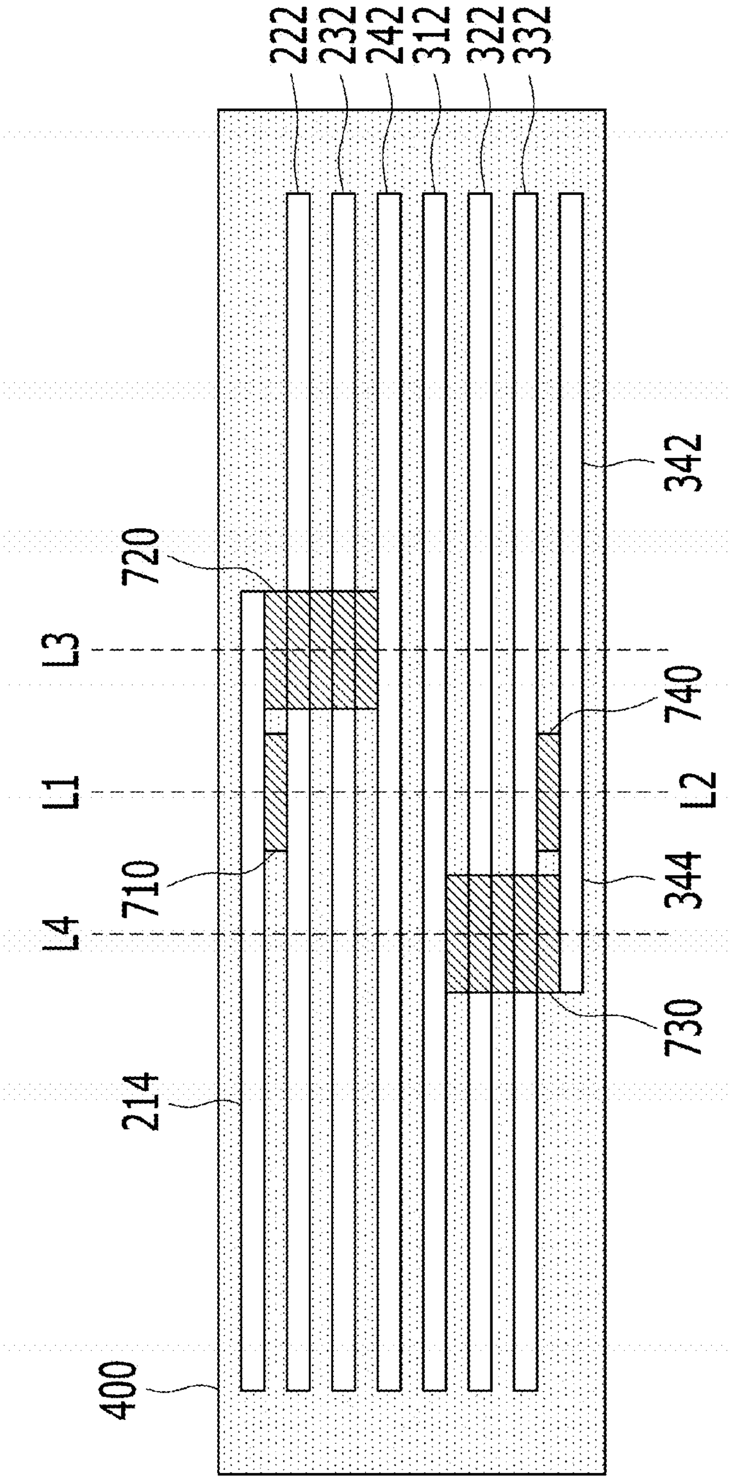

[FIG. 17]
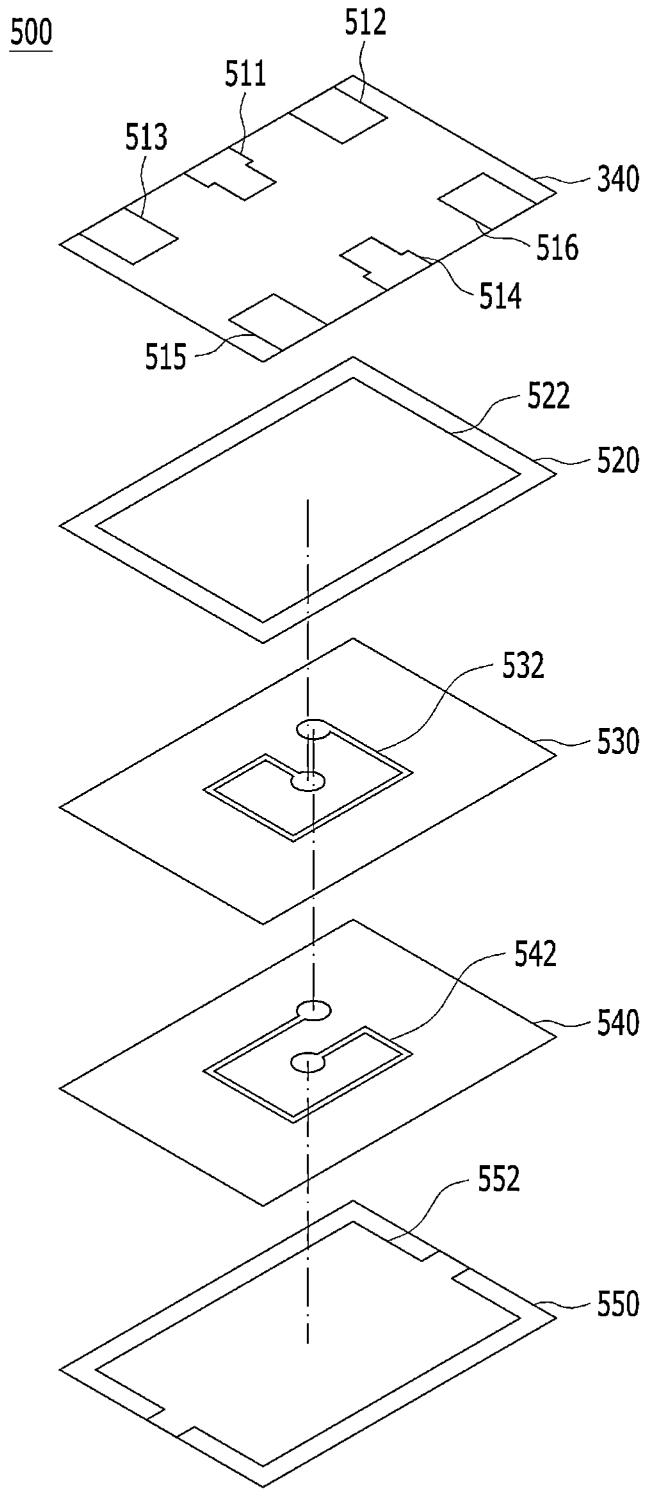

[FIG. 18]
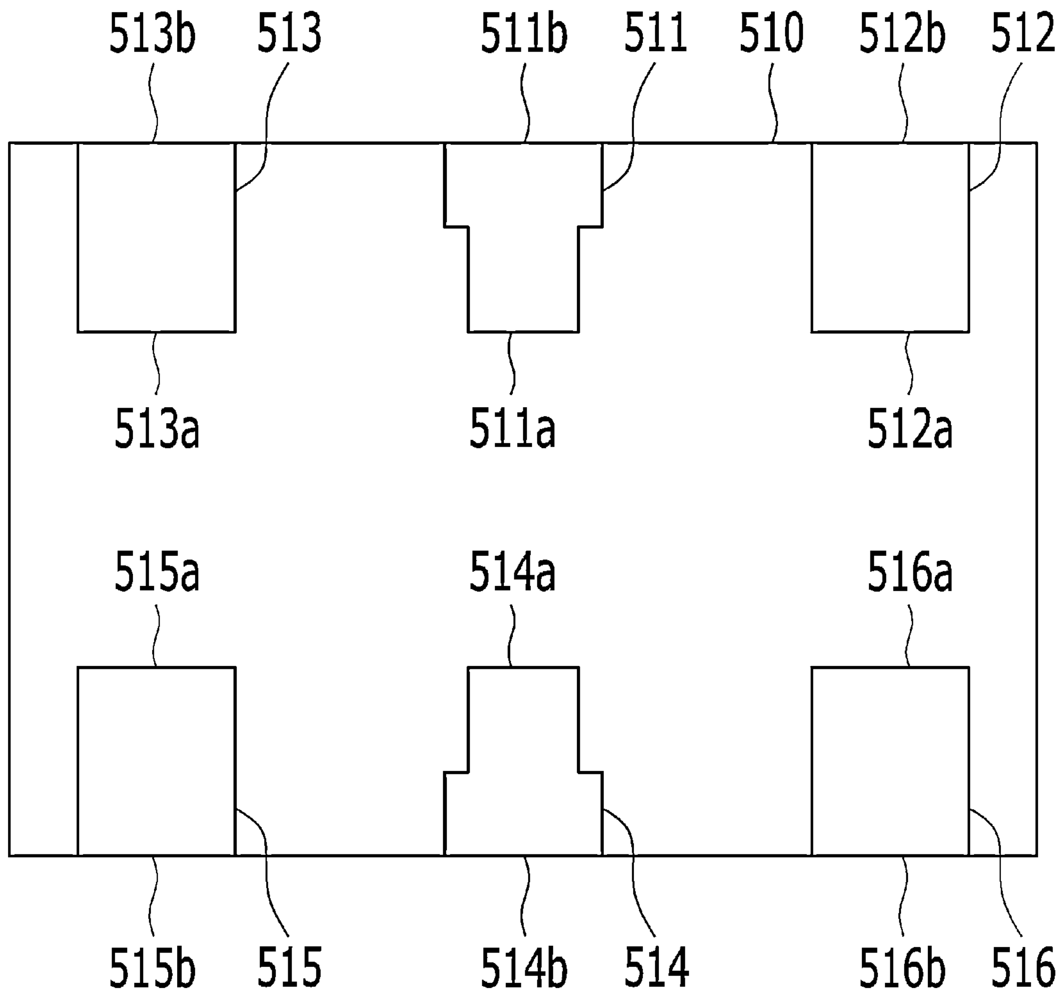

[FIG. 19]
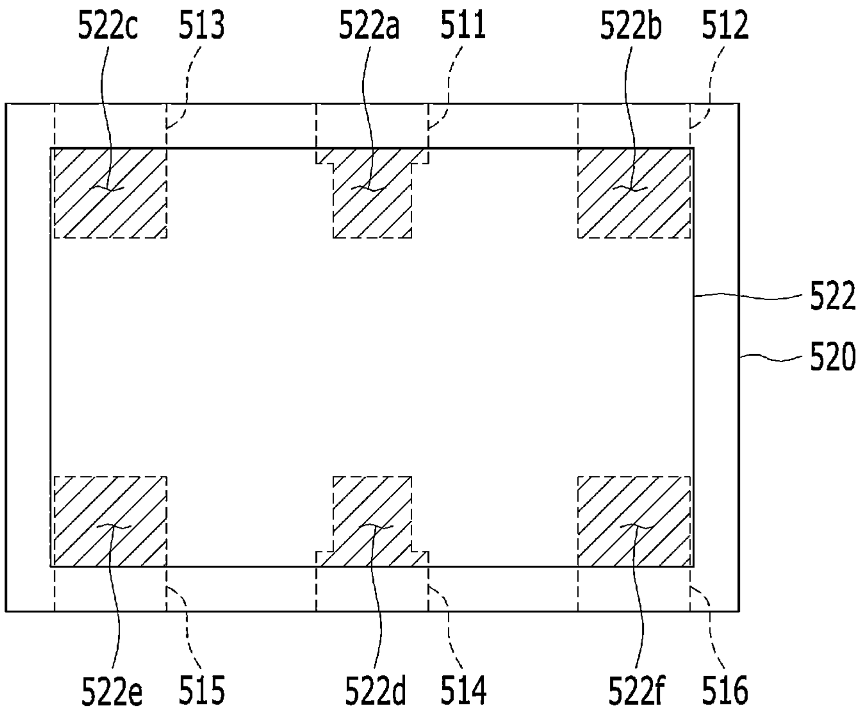

[FIG. 20]
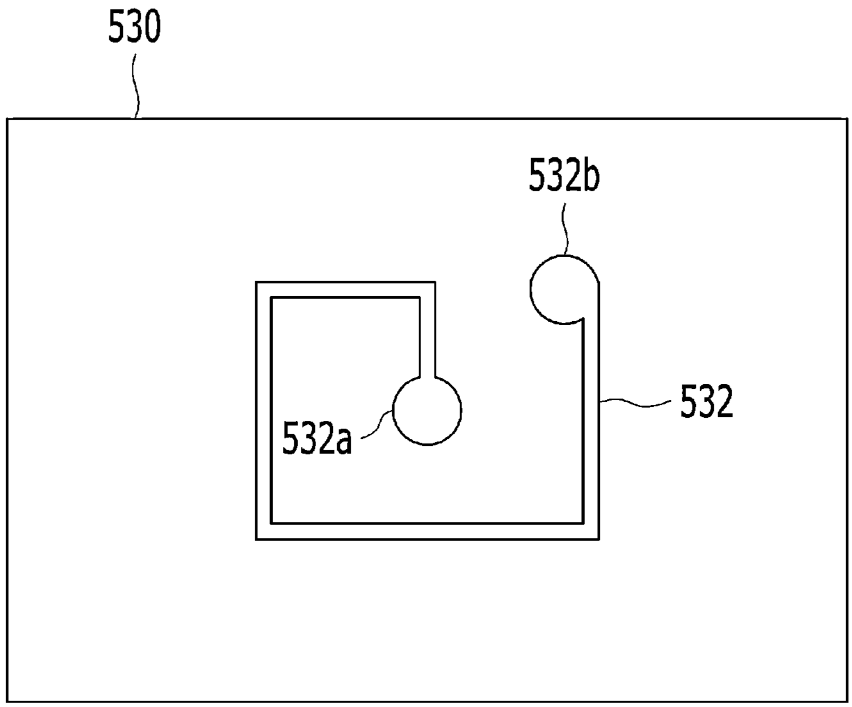
[FIG. 21]
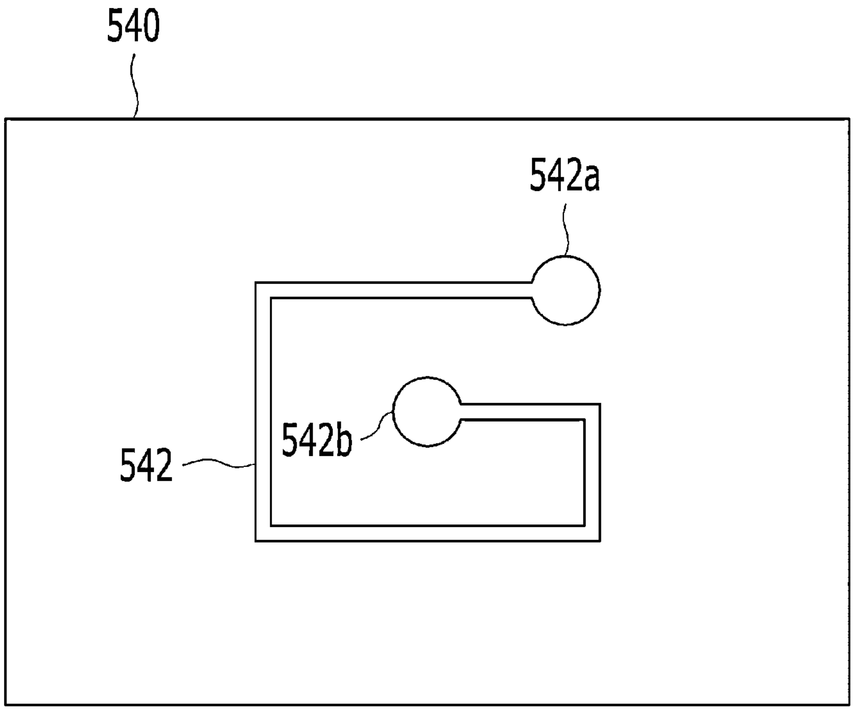

[FIG. 22]
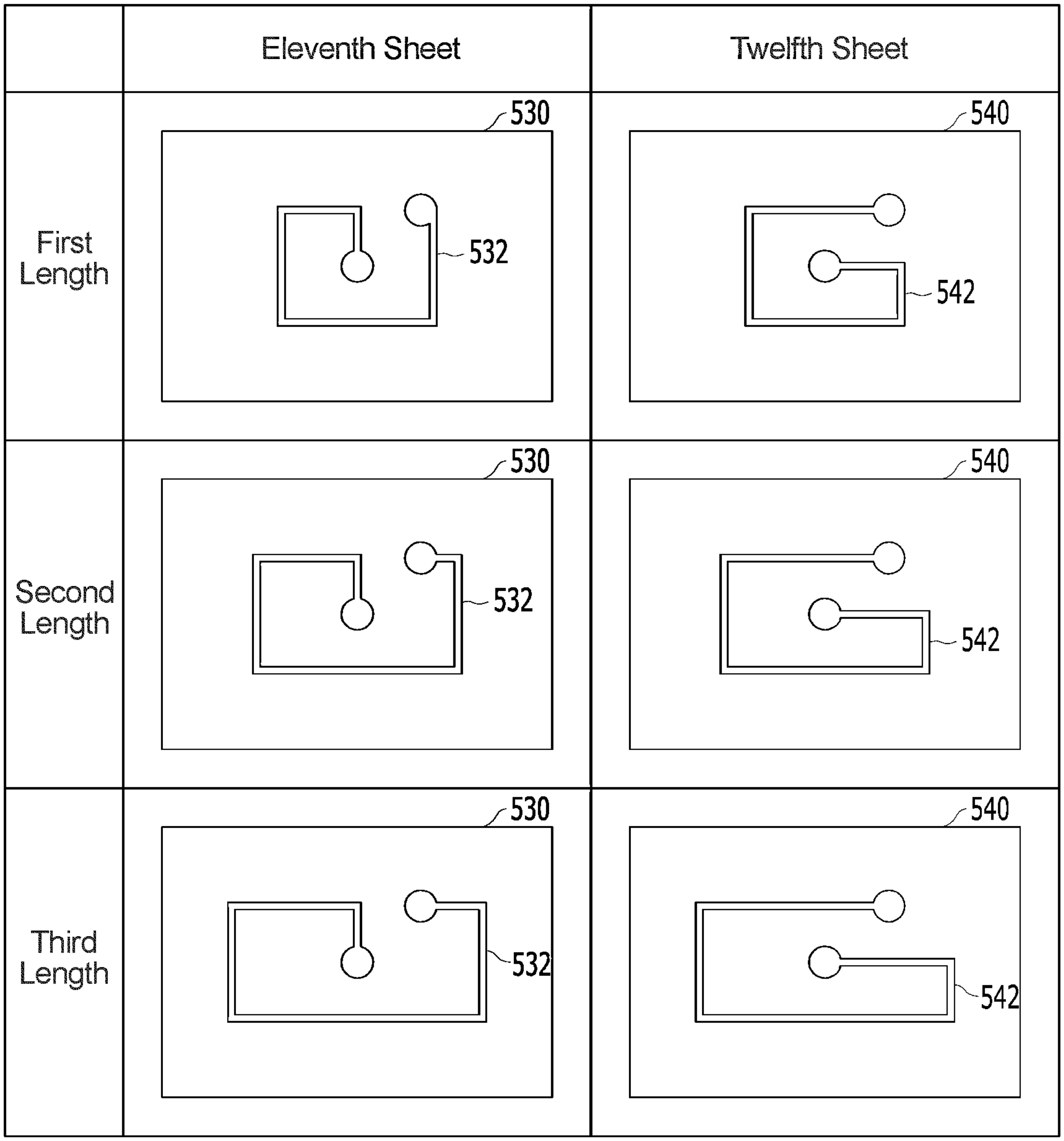

[FIG. 23]
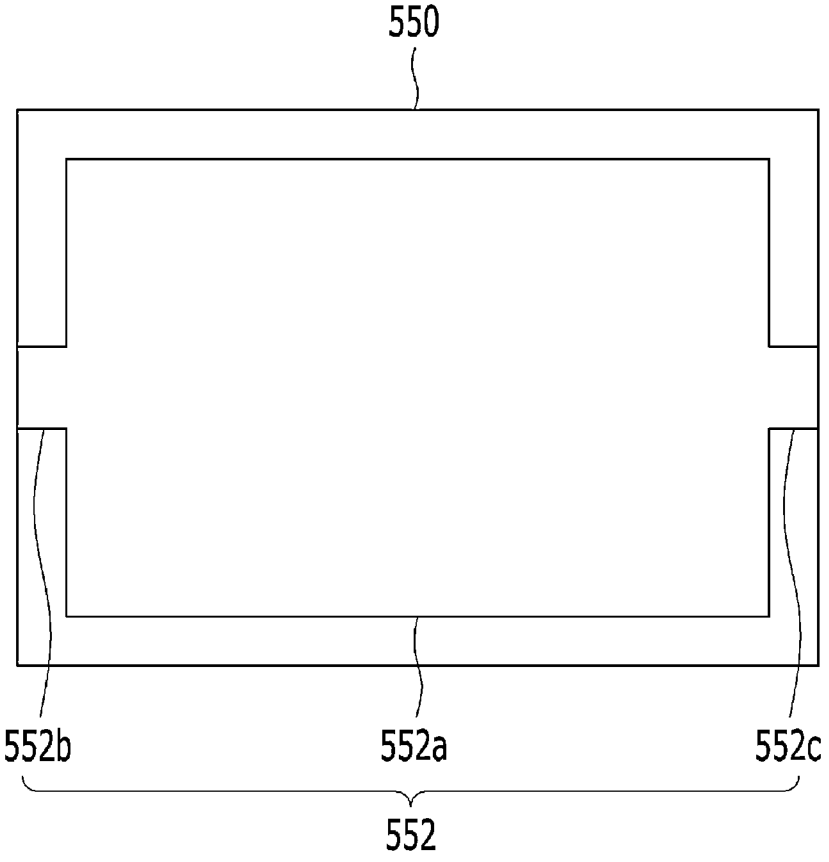

[FIG. 24]
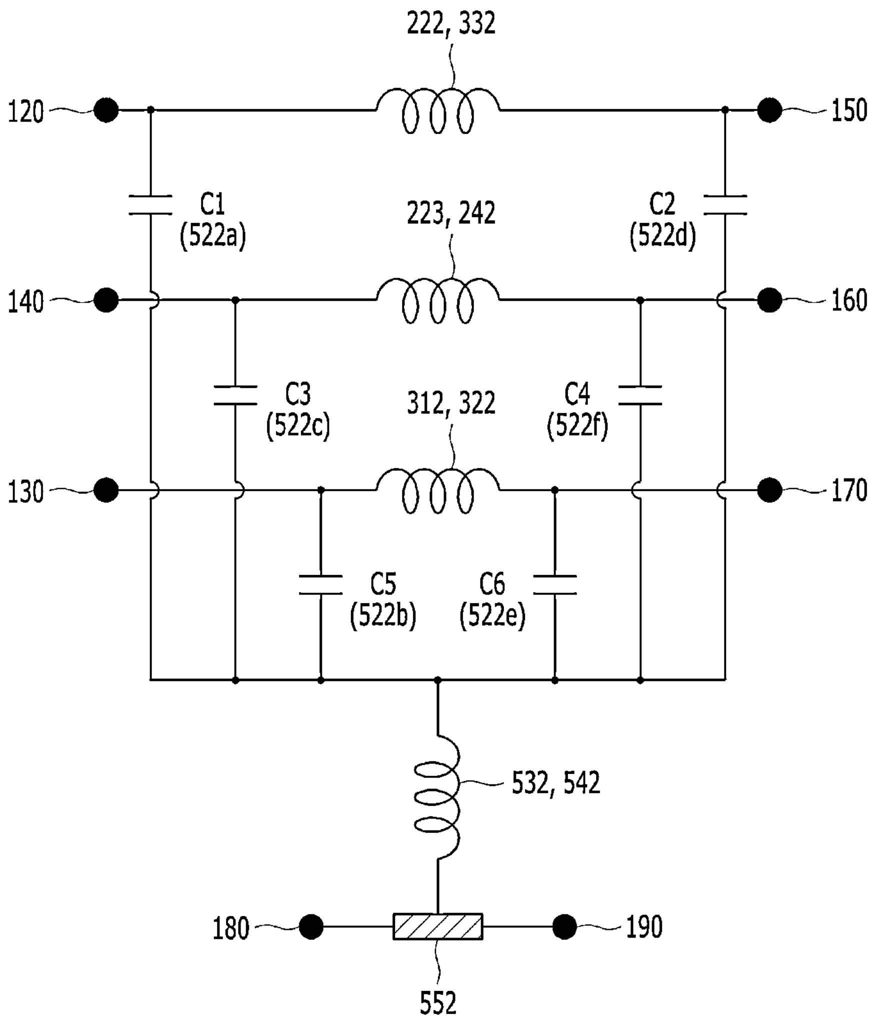

[FIG. 25]
| Classification | Vertical Cross-Section of Filter Stack |
| --- | --- |
| First Multilayer Common Mode Filter | 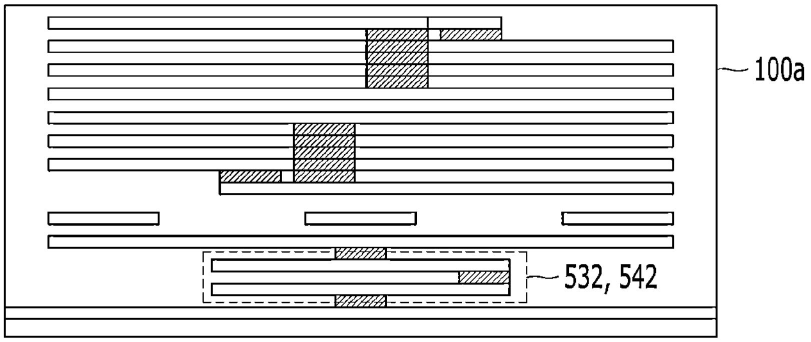 |
| Second Multilayer Common Mode Filter | 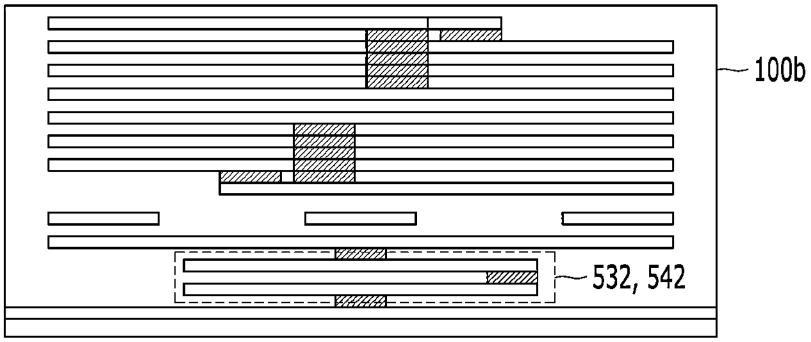 |
| Third Multilayer Common Mode Filter | 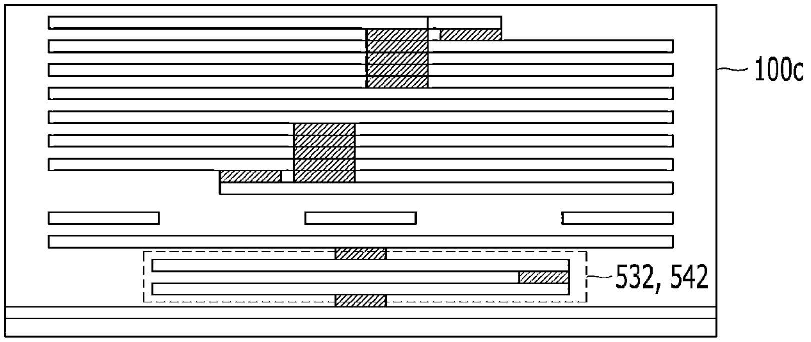 |

[FIG. 26]
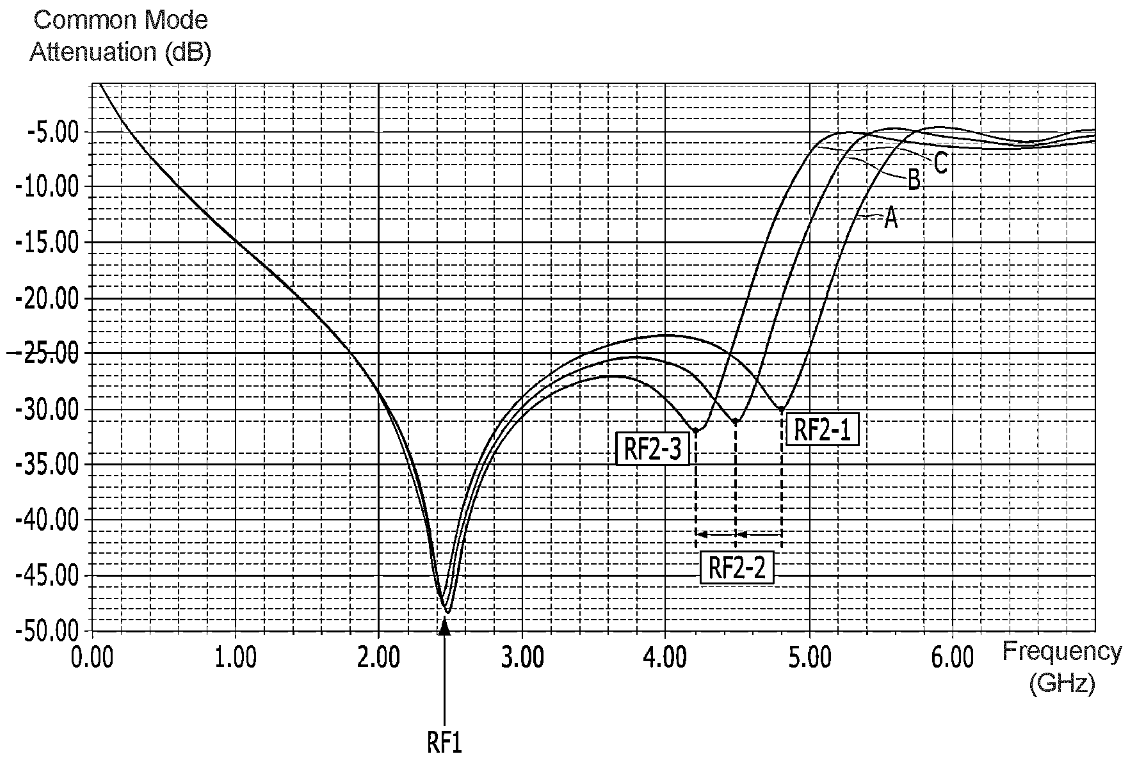

[FIG. 27]
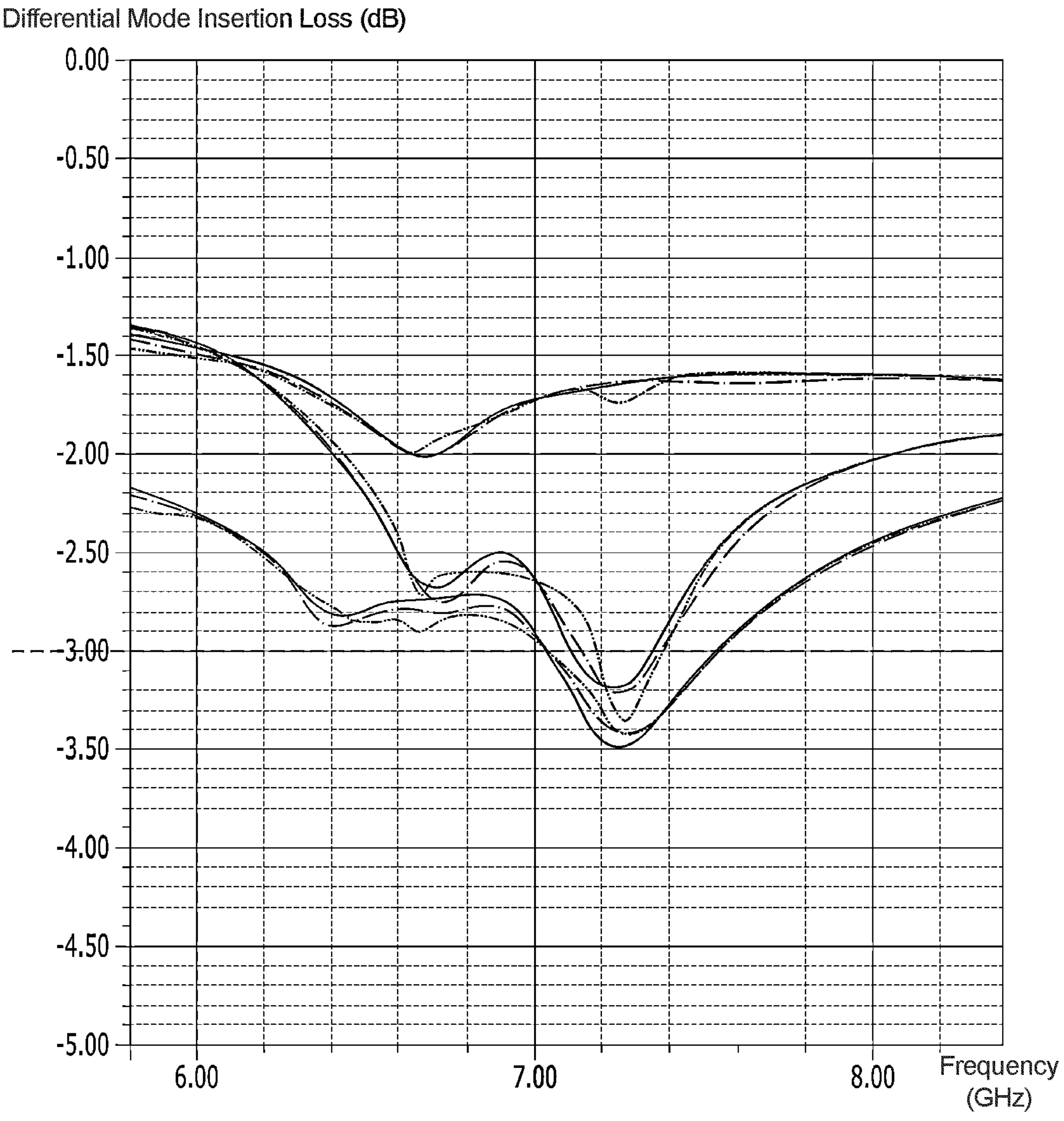

[FIG. 28]
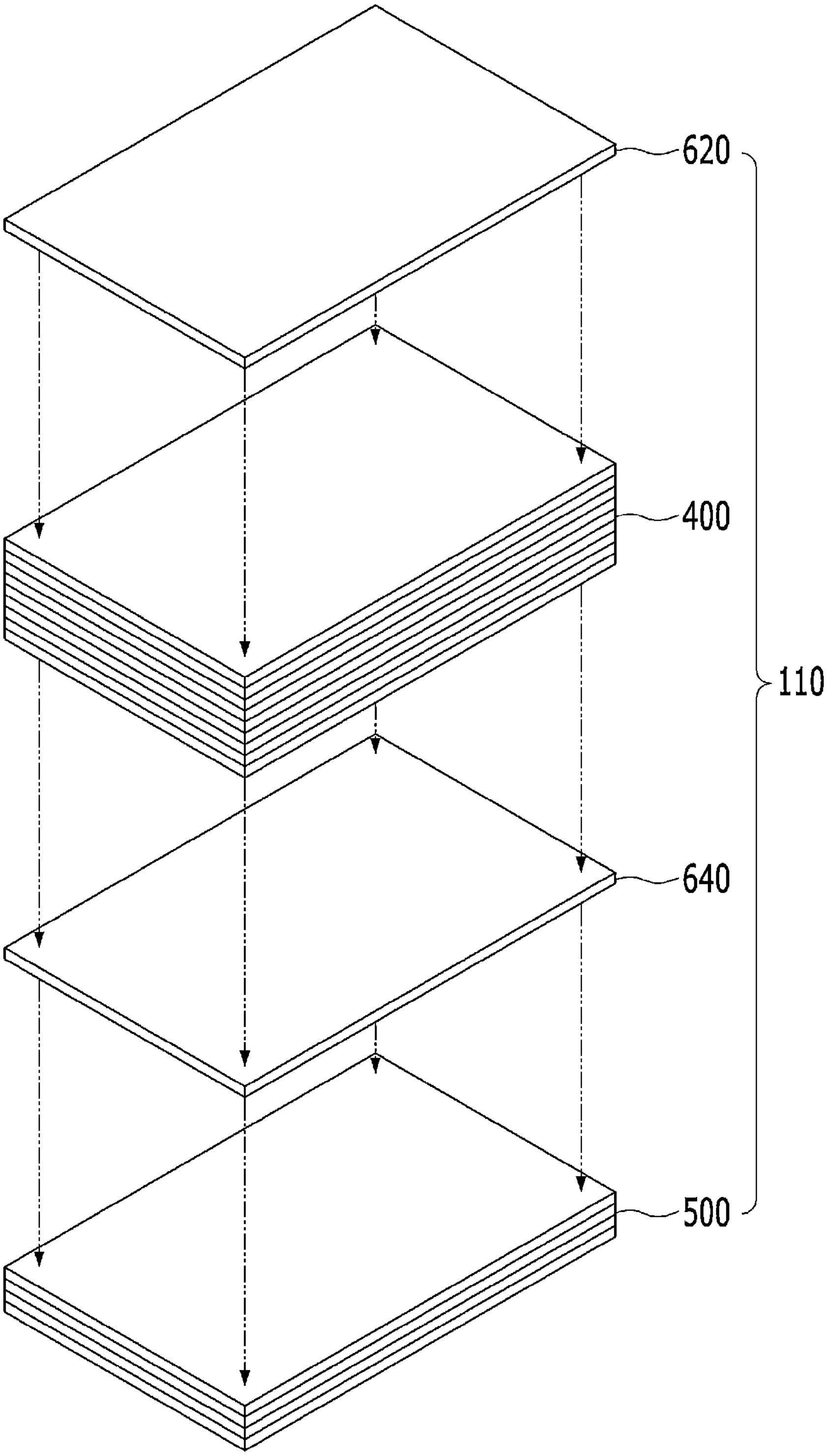

[FIG. 29]
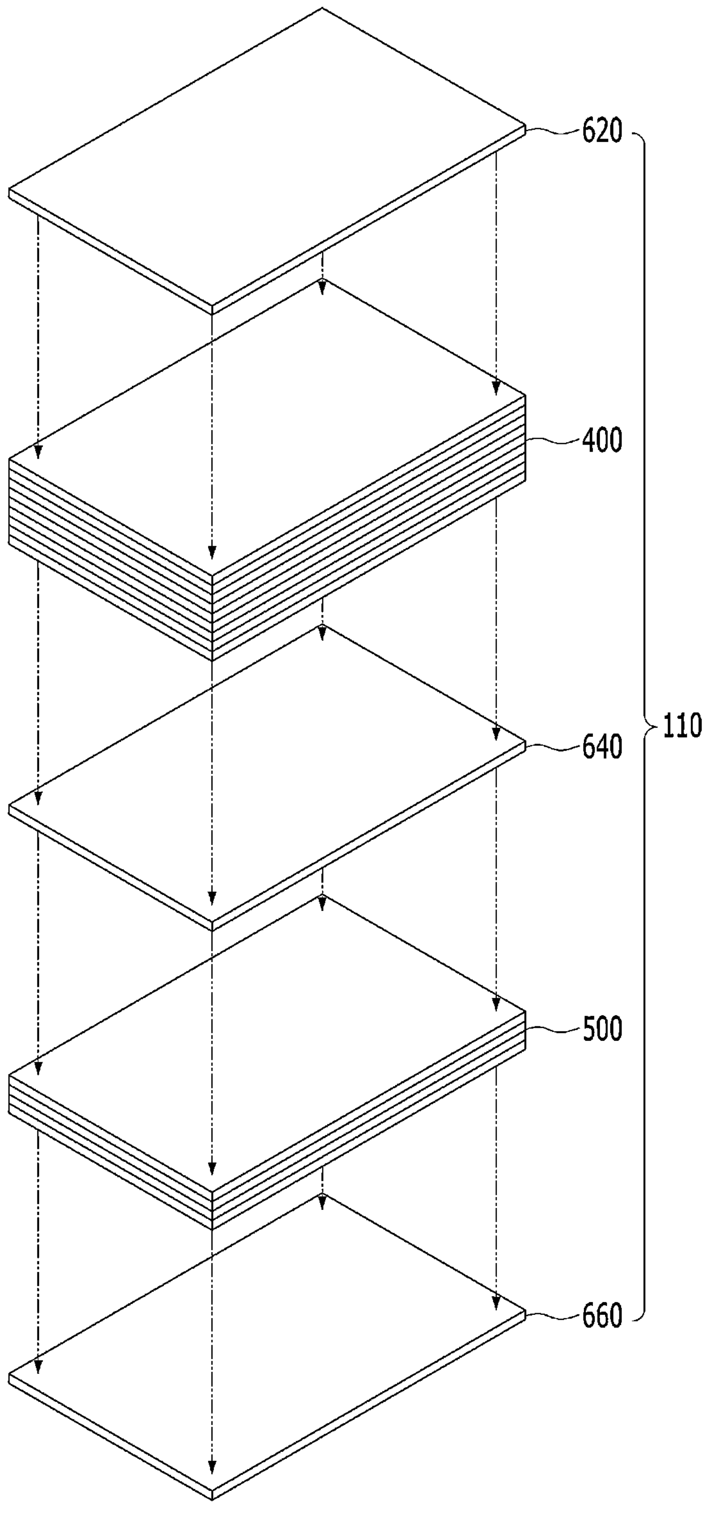

[FIG. 30]

<table>
<tr><th>Classifi-cation</th><th>Third Magnetic Sheet</th><th>Inductor Pattern</th><th>Vertical Cross-Section of Filter Stack (Excluding External Electrode)</th></tr>
<tr><td>First Multilayer Common Mode Filter</td><td>Not included</td><td>First Length</td><td>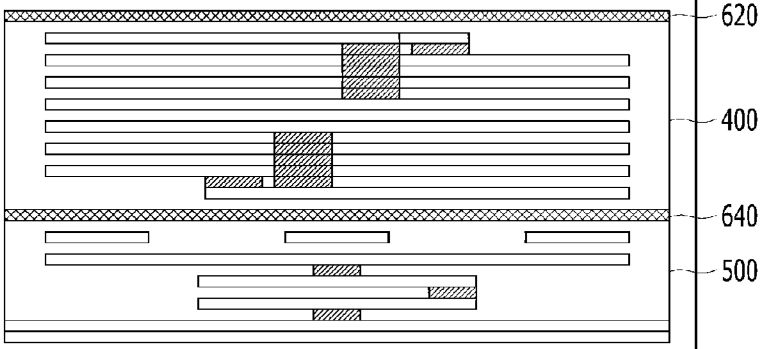
</td></tr>
<tr><td>Second Multilayer Common Mode Filter</td><td>Not included</td><td>Second Length</td><td>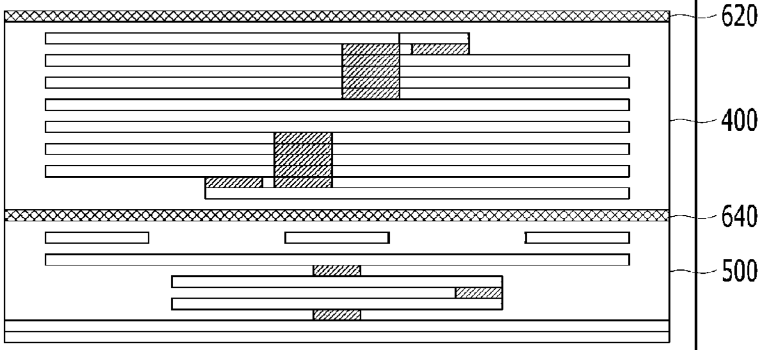
</td></tr>
<tr><td>Third Multilayer Common Mode Filter</td><td>Included</td><td>First Length</td><td>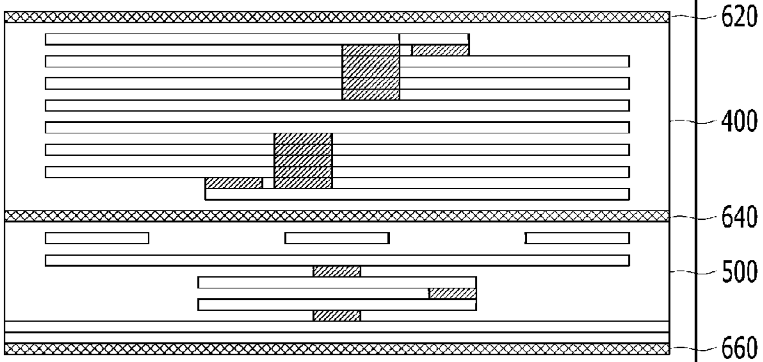
</td></tr>
<tr><td>Fourth Multilayer Common Mode Filter</td><td>Included</td><td>Second Length</td><td>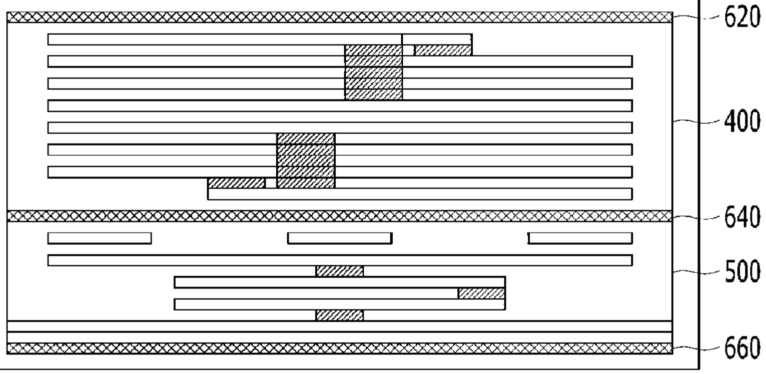
</td></tr>
</table>

[FIG. 31]
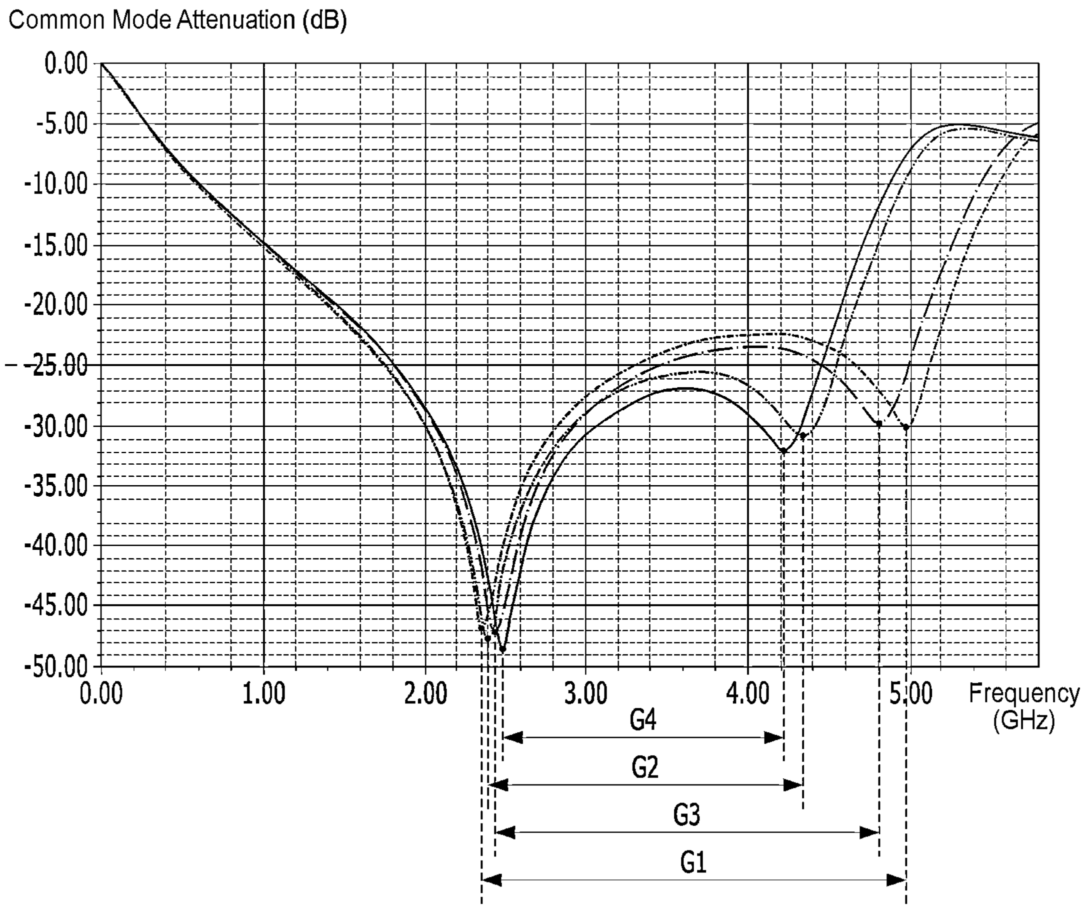

[FIG. 32]
| Classification | Vertical Cross-Section of Filter Stack |
| --- | --- |
| Prior Art | 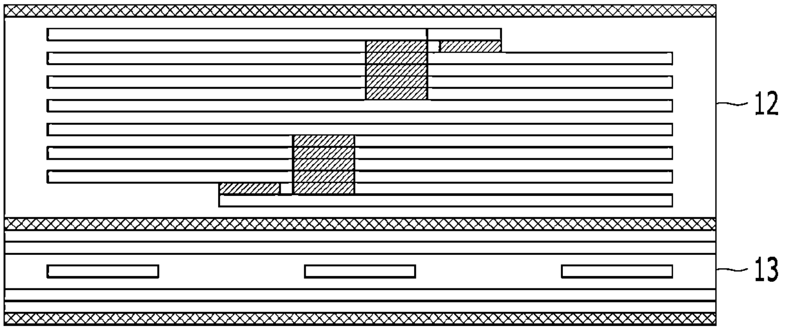 |
| Present Disclosure | 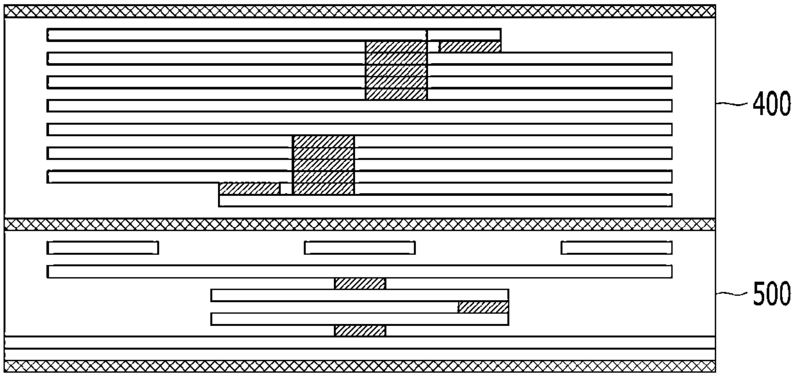 |

[FIG. 33]
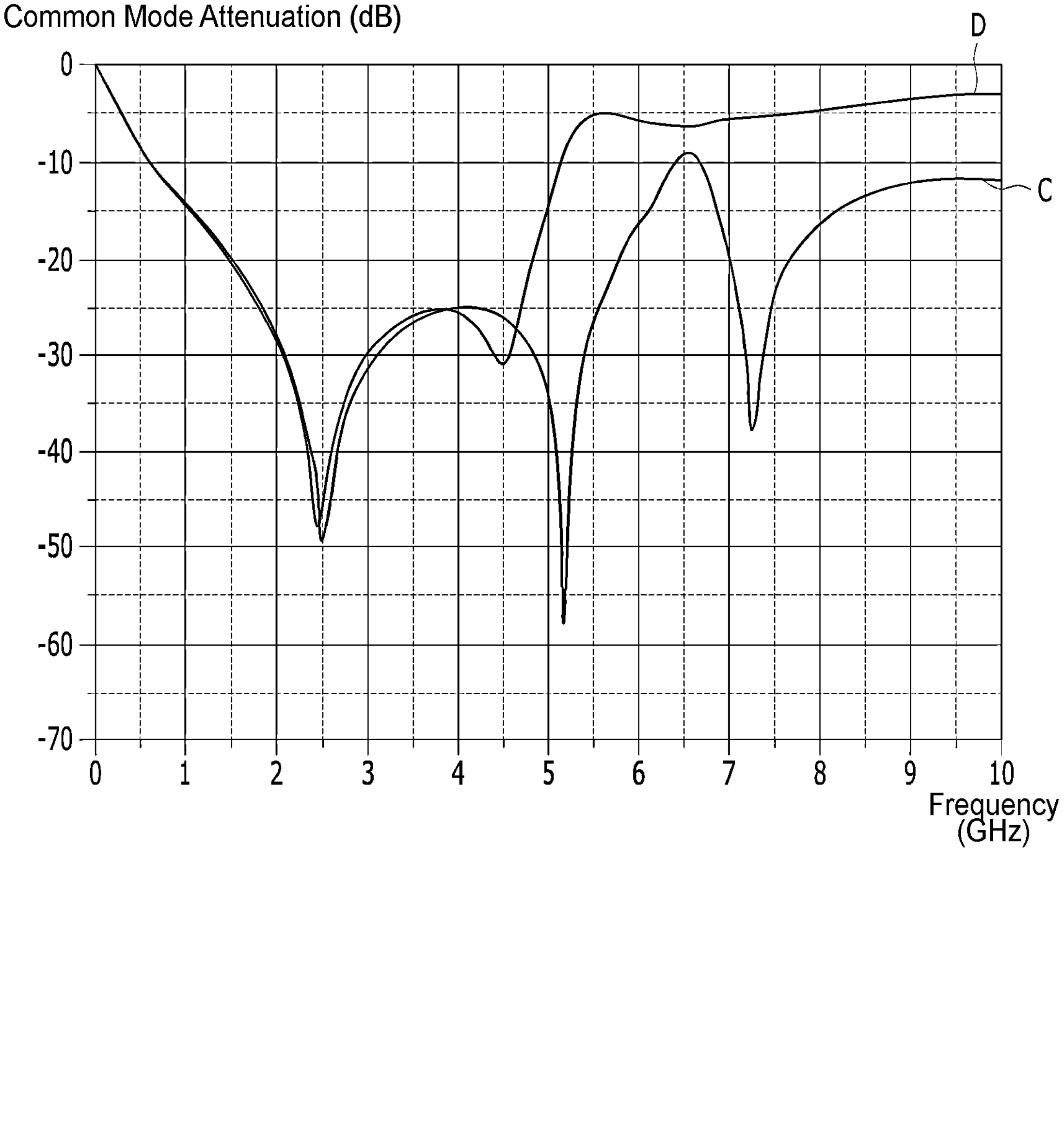

[FIG. 34]
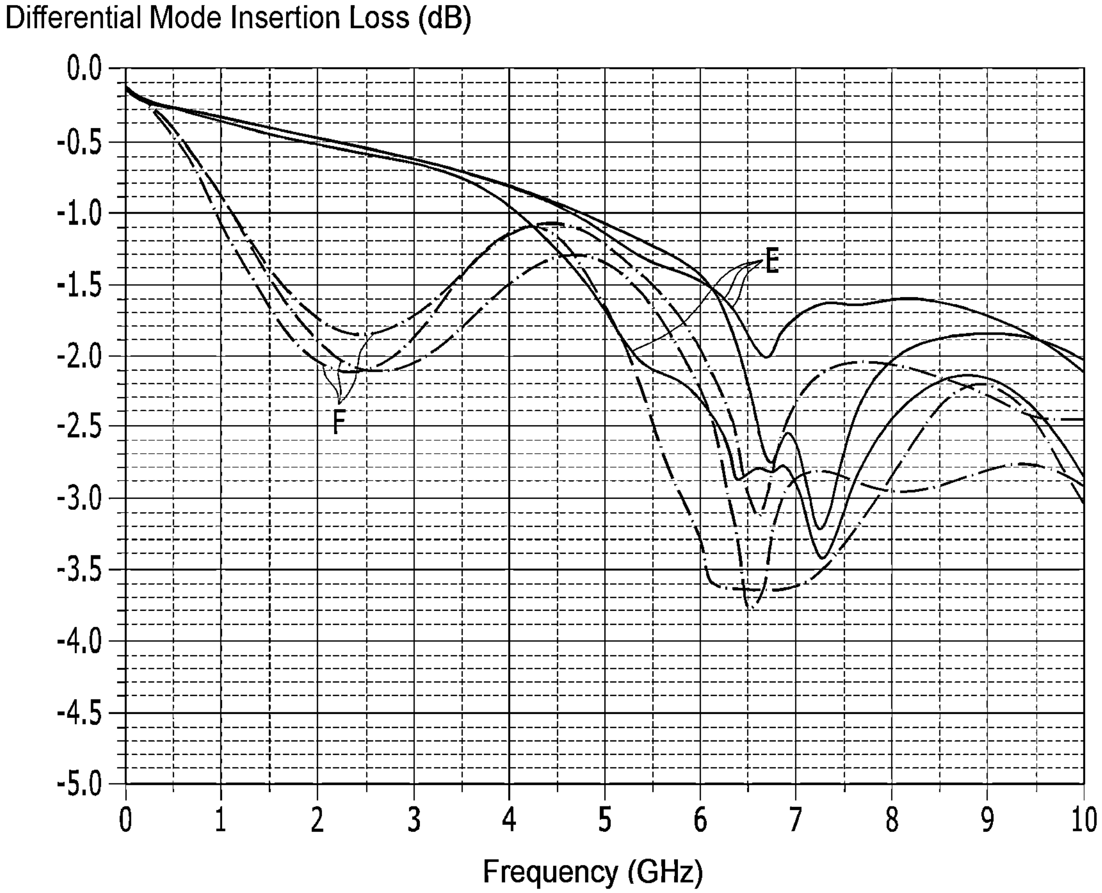

MULTILAYER COMMON MODE FILTER

TECHNICAL FIELD

The present disclosure relates to a multilayer common mode filter that allows signal current in a differential mode to pass through and removes noise current in a common mode in an electronic device to which a high-speed signal line is applied.

BACKGROUND ART

Generally, mobile terminals adopt the Mobile Industry Processor Interface (MIPI) D-PHY standard as a digital data transmission standard. The MIPI D-PHY standard is a digital data transmission standard that connects a main circuit of a mobile terminal to a display or camera, and refers to a method of transmitting data using a differential signal with two transmission lines.

With the rapid increase in the volume of data transmitted and received within mobile terminals, a transmission method capable of transmitting and receiving data at a higher speed than the MIPI D-PHY standard is required for mobile terminals.

Accordingly, recent research in the mobile terminal industry has been conducted on applying the MIPI C-PHY standard to mobile terminals. The MIPI C-PHY standard employs three transmission lines, transmitting different voltages to the respective transmission lines from a transmitting side and performing differential output on a receiving side by taking differences between the lines.

The contents described in the Background Art are to aid in understanding the background of the disclosure, and may include contents that are not related to disclosed prior technology.

SUMMARY OF INVENTION

Technical Problem

The present disclosure is proposed in consideration of the circumstances, and an object of the present disclosure is to provide a multilayer common mode filter in which a stack including a capacitor pattern, a floating pattern, an inductor pattern, and a ground pattern is disposed under a filter stack, thereby enabling control of characteristics such as a resonance point (resonant frequency) and cutoff.

Furthermore, another object of the present disclosure is to provide a multilayer common mode filter in which a plurality of via conductors, each including via holes for connecting coil patterns, are arranged without overlapping one another, thereby preventing defects occurring during a stacking process, and enabling adjustment of filter characteristics.

Solution to Problem

To achieve the above object, a multilayer common mode filter according to an embodiment of the present disclosure may include a first stack provided with a first coil pattern, a second coil pattern, and a third coil pattern, and a second stack provided with a fourth coil pattern, a fifth coil pattern, and a sixth coil pattern, and disposed under the first stack to form a coil stack along with the first stack. The coil stack may include a first via conductor connected to the first coil pattern in the first stack, a second via conductor connected to the sixth coil pattern in the second stack, a third via conductor connected to the second coil pattern and the third coil pattern in the first stack, and a fourth via conductor connected to the fourth coil pattern and the fifth coil pattern in the second stack. In a top view of the coil stack, the fourth via conductor may be disposed at a position that does not overlap the first via conductor, the second via conductor, and the third via conductor.

The first stack may further include a first terminal pattern and a second terminal pattern. The second stack may further include a third terminal pattern and a fourth terminal pattern. The first via conductor may connect the first coil pattern to the first terminal pattern in the first stack. The second via conductor may connect the sixth coil pattern to the fourth terminal pattern in the second stack. The third via conductor may connect the second coil pattern and the third coil pattern to the second terminal pattern in the first stack. The fourth via conductor may connect the fourth coil pattern and the fifth coil pattern to the third terminal pattern in the second stack.

In the top view of the coil stack, the third via conductor is disposed at a position that does not overlap the first via conductor and the second via conductor, and the first via conductor may be disposed at a position that does not overlap the second via conductor. Alternatively, the first via conductor may be disposed at a position that overlaps the second via conductor.

In a vertical sectional view of the coil stack, the first via conductor may be spaced apart from the second via conductor, the third via conductor and the fourth via conductor may be spaced apart from each other between the first via conductor and the second via conductor, and the third via conductor may be interposed between the first via conductor and the fourth via conductor.

In a vertical sectional view of the coil stack, the third via conductor may be spaced apart from the fourth via conductor, the first via conductor and the second via conductor may be spaced apart from each other between the third via conductor and the fourth via conductor, and the first via conductor may be interposed between the second via conductor and the third via conductor.

In a vertical sectional view of the coil stack, the third via conductor may be spaced apart from the fourth via conductor, the first via conductor and the second via conductor may be interposed between the third via conductor and the fourth via conductor, and may be disposed to overlap in the top view of the coil stack.

Advantageous Effects of Invention

According to the present disclosure, a multilayer common mode filter has an effect of allowing a distance (spacing) between coil patterns forming each channel to be kept constant, thereby enabling resistance and inductance of the coil patterns forming each channel to remain uniform.

Furthermore, the multilayer common mode filter has an effect of minimizing changes in inductance characteristics and common mode attenuation characteristics of the coil patterns by disposing terminal patterns for connection with external electrodes in uppermost and lowermost portions of a filter stack.

In addition, the multilayer common mode filter has an effect of expanding an attenuation band by forming an additional notch in common mode attenuation characteristics through placement of a capacitor pattern and a floating pattern below a coil stack.

Additionally, the multilayer common mode filter has an effect of achieving broadband characteristics by forming an additional pole (i.e., additional capacitance) through the capacitor pattern and the floating pattern, along with a pole formed by the coil patterns of an electrode stack.

Furthermore, the multilayer common mode filter has an effect of minimizing variations in the inductance characteristics of the coil patterns by forming a constant distance (spacing) between the channels.

In addition, the multilayer common mode filter has an effect of enhancing magnetic coupling (i.e., electromagnetic coupling) among first to third coils and minimizing the degradation of a differential signal.

Additionally, the multilayer common mode filter has an effect of simplifying a manufacturing process because the electrode stack can be formed by stacking sheets in which two or fewer via holes are formed.

That is, in the multilayer common mode filter, the terminal patterns are disposed in uppermost and lowermost portions of the electrode stack, a second coil pattern and a third coil pattern of a second channel are placed between a first coil pattern and a sixth coil pattern of a first channel, and a fourth coil pattern and a fifth coil pattern of a third channel are placed between the third coil pattern and the sixth coil pattern. Accordingly, the number of via holes required to connect the coil patterns may be minimized, and two or fewer via holes are formed in each sheet.

Furthermore, the multilayer common mode filter has an effect of increasing capacitance, without adding an electrode layer that includes a coil pattern or increasing the area of the coil pattern, thereby achieving a greater capacitance than prior multilayer common mode filters within the same size.

In addition, the multilayer common mode filter has an effect of changing characteristics of a second resonant frequency by adjusting the length of an inductor pattern.

Furthermore, the multilayer common mode filter has an effect of readily adjusting and controlling the second resonant frequency because a short path circuit formed of the floating pattern, the inductor pattern, and a ground pattern is configured through a third stack disposed under the coil stack.

In addition, the multilayer common mode filter has an effect of enabling adjustment of a distance between a first resonant frequency and a second resonant frequency by placing or removing a magnetic sheet in or from the lowermost portion of the filter stack.

Furthermore, the multilayer common mode filter according to an embodiment of the present disclosure has an effect of preventing pressure from being concentrated in regions, where via conductors are located, during a stacking process by dispersing pressure through distributed arrangement of the via conductors in a non-overlapping manner.

Furthermore, the multilayer common mode filter according to an embodiment of the present disclosure has an effect of preventing cracks from being formed in a stack during the stacking process, as the pressure applied to the stack is dispersed during the stacking process through the distributed arrangement of the via conductors.

In addition, the multilayer common mode filter according to an embodiment of the present disclosure has an effect of preventing short-circuit occurrence by avoiding electrode compression caused by pressure concentration, as the pressure applied to the stack during the stacking process can be dispersed through the distributed arrangement of the via conductors.

Additionally, the multilayer common mode filter according to an embodiment of the present disclosure has an effect of enabling the flattening of a surface of the stack by preventing the formation of irregularities between a via conductor region and a surrounding region during the stacking process through the distributed arrangement of the via conductors.

Furthermore, the multilayer common mode filter according to an embodiment of the present disclosure has an effect of enabling the prevention of cracks in the stack and the flattening of the surface of the stack by uniformly dispersing pressure during the stacking process through the overlapping arrangement of relatively thin via conductors having a first thickness, and the distributed arrangement of relatively thick via conductors having a second thickness.

In addition, the multilayer common mode filter according to an embodiment of the present disclosure has an effect of enabling the adjustment (tuning) of the characteristics of the filter by adjusting a distance between the via conductors. Here, the multilayer common mode filter according to an embodiment of the present disclosure has an effect of enhancing both noise attenuation performance by reducing a first distance and/or a second distance and high-speed signal transmission characteristics by increasing the cut-off frequency through widening the first distance and/or the second distance.

BRIEF DESCRIPTION OF DRAWINGS

FIG. 1 is a perspective view of a multilayer common mode filter according to an embodiment of the present disclosure.

FIG. 2 is an exploded perspective view for describing a filter stack in FIG. 1.

FIG. 3 is an exploded perspective view for describing a first stack in FIG. 2.

FIG. 4 is a diagram for describing a first sheet in FIG. 3.

FIG. 5 is a diagram for describing a second sheet in FIG. 3.

FIG. 6 is a diagram for describing a third sheet in FIG. 3.

FIG. 7 is a diagram for describing a fourth sheet in FIG. 3.

FIG. 8 is an exploded perspective view for describing a second stack in FIG. 2.

FIG. 9 is a diagram for describing a fifth sheet in FIG. 8.

FIG. 10 is a diagram for describing a sixth sheet in FIG. 8.

FIG. 11 is a diagram for describing a seventh sheet in FIG. 8.

FIG. 12 is a diagram for describing an eighth sheet in FIG. 8.

FIGS. 13 to 16 are sectional views showing a vertical cross-section of a coil stack in FIG. 2.

FIG. 17 is an exploded perspective view for describing a third stack in FIG. 2.

FIG. 18 is a diagram for describing a ninth sheet in FIG. 17.

FIG. 19 is a diagram for describing a tenth sheet in FIG. 17.

FIG. 20 is a diagram for describing an eleventh sheet in FIG. 17.

FIGS. 21 and 22 are diagrams for describing a twelfth sheet in FIG. 17.

FIG. 23 is a diagram for describing a thirteenth sheet in FIG. 17.

FIG. 24 is a diagram illustrating an equivalent circuit of the multilayer common mode filter according to an embodiment of the present disclosure.

FIGS. 25 to 27 are diagrams for comparatively explaining the characteristics of a multilayer common mode filter according to changes in the length (area) of an inductor pattern.

FIGS. 28 and 29 are exploded perspective views for explaining modified examples of the multilayer common mode filter according to an embodiment of the present disclosure.

FIGS. 30 and 31 are diagrams for comparatively explaining the characteristics of the multilayer common mode filter depending on the presence or absence of a third magnetic sheet shown in FIG. 29.

FIGS. 32 to 34 are diagrams for comparatively explaining the characteristics of a multilayer common mode filter according to an embodiment of the present disclosure and a prior multilayer common mode filter.

DESCRIPTION OF EMBODIMENTS

Hereinafter, embodiments of the present disclosure will be described in detail with reference to the attached drawings.

Embodiments are provided to explain the present disclosure more fully to a person having ordinary knowledge in the art to which the present disclosure pertains. The following embodiments may be modified in various other forms, and the scope of the present disclosure is not limited to the following embodiments. Rather, these embodiments are provided to make the present disclosure more thorough and complete and to fully convey the spirit of the present disclosure.

Terms used in this specification are used to describe a specific embodiment, and are not intended to limit the present disclosure. Furthermore, in this specification, an expression of the singular number may include an expression of the plural number unless clearly defined otherwise in the context.

In the description of embodiments, when it is described that each layer (film), area, pattern, or structure is formed "on" or "under" each substrate, layer (film), area, pad, or pattern, this includes both expressions, including that a layer is formed on another layer "directly" or "with an additional layer interposed between the two layers (indirectly)". Furthermore, the criterion for "on" or "under" of each layer is based on the drawings.

The drawings are provided solely to aid in understanding the spirit of the present disclosure and should not be interpreted as limiting the scope of the present disclosure. Furthermore, in the drawings, relative thickness, length, or size may be exaggerated for convenience and clarity of description.

Referring to FIG. 1, a multilayer common mode filter 100 according to an embodiment of the present disclosure includes a filter stack 110, a first external electrode 120, a second external electrode 130, a third external electrode 140, a fourth external electrode 150, a fifth external electrode 160, a sixth external electrode 170, a seventh external electrode 180, and an eighth external electrode 190. Hereinafter, the multilayer common mode filter 100 operating as a three-channel C-PHY common mode filter will be described as an example.

The filter stack 110 is a stack in which sheets, on which six coil patterns forming three channels, a capacitor pattern for adjusting characteristics such as a resonant frequency, a floating pattern 522, inductor patterns 532 and 542, and a ground pattern 552 are arranged, are stacked. The multilayer common mode filter 100 adjusts resonance point (resonant frequency) shift, cutoff characteristics, and the like through the capacitor pattern and a floating pattern 522 that form capacitance, inductor patterns 532 and 542 constituting inductance, and a ground pattern 552 ground pattern 552 forming a ground.

Referring to FIG. 2, the filter stack 110 includes a first stack 200, a second stack 300 disposed under the first stack 200, and a third stack 500 disposed under the second stack 300.

The first stack 200 is formed by stacking a plurality of sheets on which metal patterns are formed. For example, referring to FIG. 3, the first stack 200 includes a first sheet 210, a second sheet 220 disposed under the first sheet 210, a third sheet 230 disposed under the second sheet 220, and a fourth sheet 240 disposed under the third sheet 230.

Here, metal patterns corresponding to terminal patterns 212 and 214 are formed in the first sheet 210, and metal patterns corresponding to coil patterns 222, 232, and 242 are formed in the second to fourth sheets 220 to 240.

Referring to FIG. 4, a first terminal pattern 212 and a second terminal pattern 214 for connecting coil patterns of a first electrode layer to external electrodes are formed on the first sheet 210.

The first terminal pattern 212 is placed on an upper surface of the first sheet 210. A first end **212*a* of the first terminal pattern 212 is disposed adjacent to a center of the first sheet 210**.

A second end **212*b* of the first terminal pattern 212 is disposed to be aligned with a first side of the first sheet 210. Accordingly, the second end 212*b* of the first terminal pattern 212 is exposed to a first side surface of the filter stack 110, and connected to the first external electrode 120**.

The second terminal pattern 214 is placed on the upper surface of the first sheet 210 so as to be spaced apart from the first terminal pattern 212. A first end **214*a* of the second terminal pattern 214 is disposed adjacent to the center of the first sheet 210. The first end 214*a* of the second terminal pattern 214 is spaced apart from the first end 212*a* of the first terminal pattern 212** by a predetermined distance.

A second end **214*b* of the second terminal pattern 214 is disposed to be aligned with the first side of the first sheet 214. Accordingly, the second end 214*b* of the second terminal pattern 214 is spaced apart from the second end 212*b* of the first terminal pattern 212 by a predetermined distance, and is exposed to the first side surface of the filter stack 110, and connected to the third external electrode 140**.

Referring to FIG. 5, the second sheet 220 is disposed under the first sheet 210. A first via hole V1 and a first coil pattern 221 that forms a first channel are disposed in the second sheet 220.

The first coil pattern 222 is placed on an upper surface of the second sheet 220. The first coil pattern 222 is wound multiple times on the upper surface of the second sheet 220, thus forming a first loop. The first coil pattern 222 is wound multiple times around a virtual winding axis passing through a center of the second sheet 220 to form the first loop.

A first end **222*a* of the first coil pattern 222 is disposed in an inner peripheral region of the first loop, and positioned adjacent to the center of the second sheet 220. The first end 222*a* of the first coil pattern 222 is connected to the first end 212*a* of the first terminal pattern 212** through a second via hole.

A second end **222*b* of the first coil pattern 222 is disposed in an outer peripheral region of the first loop, and disposed to be aligned with a second side of the second sheet 220. Accordingly, the second end 222*b*** of the first coil pattern 222 is exposed to a second side surface of the filter stack 110, and connected to the fourth external electrode 150.

The first via hole V1 is disposed so as to be adjacent to the center of the second sheet 220 and to be spaced apart from the first end 222*a* of the first coil pattern 222. The first via hole V1 is formed to penetrate through the second sheet 220. An upper portion of the first via hole V1 is connected to the second terminal pattern 214. A lower portion of the first via hole is connected to the coil pattern that is formed in the third sheet 230, which will be described below.

Referring to FIG. 6, the third sheet 230 is disposed under the second sheet 220. A second coil pattern 232 that forms a second channel is disposed in the third sheet 230.

The second coil pattern 232 is placed on an upper surface of the third sheet 230. The second coil pattern 232 is wound multiple times on the upper surface of the third sheet 230, thus forming a second loop. The second coil pattern 232 is wound multiple times around a virtual winding axis passing through a center of the third sheet 230 to form the second loop.

A first end 232*a* of the second coil pattern 232 is disposed in an inner peripheral region of the second loop, and positioned adjacent to the center of the third sheet 230. The first end 232*a* of the second coil pattern 232 is connected to the first end 214*a* of the second terminal pattern 214 through the first via hole V1 of the second sheet 220.

A second end 232*b* of the second coil pattern 232 is disposed in an outer peripheral region of the second loop, and disposed to be aligned with a second side of the third sheet 230. The second end 232*b* of the second coil pattern 232 is disposed to be spaced apart from the second end 222*b* of the first coil pattern 222 by a predetermined distance, and is exposed to the second side surface of the filter stack 110, and connected to the fifth external electrode 160.

Referring to FIG. 7, the fourth sheet 240 is disposed under the third sheet 230. A third coil pattern 242 that forms the second channel along with the second coil pattern 232 is disposed in the fourth sheet 240.

The third coil pattern 242 is placed on an upper surface of the fourth sheet 240. The third coil pattern 242 is wound multiple times on the upper surface of the fourth sheet 240, thus forming a third loop. The third coil pattern 242 is wound multiple times around a virtual winding axis passing through the center of the fourth sheet 240 to form the third loop.

A first end 242*a* of the third coil pattern 242 is disposed in an inner peripheral region of the third loop, and positioned adjacent to a center of the fourth sheet 240. The first end 242*a* of the third coil pattern 242 is connected to the first end 232*a* of the second coil pattern 232 through a via hole, and connected to the first end 214*a* of the second terminal pattern 214 through the first via hole V1 of the second sheet 220.

A second end 242*b* of the third coil pattern 242 is disposed in an outer peripheral region of the third loop, and disposed to be aligned with a second side of the fourth sheet 240. Accordingly, the second end 242*b* of the third coil pattern 242 is disposed to be spaced apart from the second end 222*b* of the first coil pattern 222 by a predetermined distance The second end 242*b* of the third coil pattern 242 is disposed to be aligned with the second end 232*b* of the second coil pattern 232, and is exposed to the second side surface of the filter stack 110 to be connected to the fifth external electrode 160 along with the second end 232*b* of the second coil pattern 232.

The second stack 300 is disposed under the first stack 200, and formed by stacking a plurality of sheets on which metal patterns are formed. For example, referring to FIG. 8, the second stack 300 includes a fifth sheet 310, a sixth sheet 320 disposed under the fifth sheet 310, a seventh sheet 330 disposed under the sixth sheet 320, and an eighth sheet 340 disposed under the seventh sheet 330. Here, metal patterns corresponding to coil patterns 312, 322, and 332 are formed in the fifth to seventh sheets 310 to 330, and metal patterns corresponding to terminal patterns 342 and 344 are formed in the eighth sheet 340.

Referring to FIG. 9, the fifth sheet 310 is disposed under the fourth sheet 240, and a fourth coil pattern 312 that forms a third channel is disposed in the fifth sheet 310.

The fourth coil pattern 312 is placed on an upper surface of the fifth sheet 310. The fourth coil pattern 312 is wound multiple times on the upper surface of the fifth sheet 310, thus forming a fourth loop. The fourth coil pattern 312 is wound multiple times around a virtual winding axis passing through a center of the fifth sheet 310 to form the fourth loop.

A first end 312*a* of the fourth coil pattern 312 is disposed in an inner peripheral region of the fourth loop, and positioned adjacent to the center of the fifth sheet 310. The first end 312*a* of the fourth coil pattern 312 is connected to a first end 322*a* of a fifth coil pattern 322, which will be described below, through a via hole.

A second end 312*b* of the fourth coil pattern 312 is disposed in an outer peripheral region of the fourth loop, and disposed to be aligned with a second side of the fifth sheet 310. The second end 312*b* of the fourth coil pattern 312 is exposed to the second side surface of the filter stack 110, and connected to the sixth external electrode 170.

Referring to FIG. 10, the sixth sheet 320 is disposed under the fifth sheet 310. The fifth coil pattern 322 that forms the third channel along with the fourth coil pattern 312 is disposed in the sixth sheet 320.

The fifth coil pattern 322 is placed on an upper surface of the sixth sheet 320. The fifth coil pattern 322 is wound multiple times on the upper surface of the sixth sheet 320, thus forming a fifth loop. The fifth coil pattern 322 is wound multiple times around a virtual winding axis passing through a center of the sixth sheet 320 to form the fifth loop.

A first end 322*a* of the fifth coil pattern 322 is disposed in an inner peripheral region of the fifth loop, and positioned adjacent to the center of the sixth sheet 320. The first end 322*a* of the fifth coil pattern 322 is connected to the first end 312*a* of the fourth coil pattern 312 through a via hole.

A second end 322*b* of the fifth coil pattern 322 is disposed in an outer peripheral region of the fifth loop, and disposed to be aligned with a second side of the sixth sheet 320. The second end 322*b* of the fifth coil pattern 322 is aligned with the second end 312*b* of the fourth coil pattern 312, and is exposed to the second side surface of the filter stack 110 to be connected to the sixth external electrode 170 along with the second end 312*b* of the fourth coil pattern 312.

Referring to FIG. 11, the seventh sheet 330 is disposed under the sixth sheet 320. A second via hole V2 and a sixth coil pattern 332 that forms the first channel along with the first coil pattern 222 of the first stack 200 are formed in the seventh sheet 330.

The sixth coil pattern 332 is placed on an upper surface of the seventh sheet 330. The sixth coil pattern 332 is wound multiple times on the upper surface of the seventh sheet 330, thus forming a sixth loop. The sixth coil pattern 332 is wound multiple times around a virtual winding axis passing through a center of the seventh sheet 330 to form the sixth loop.

A first end 332*a* of the sixth coil pattern 332 is disposed in an inner peripheral region of the sixth loop, and positioned adjacent to the center of the seventh sheet 330.

A second end 332*b* of the sixth coil pattern 332 is disposed in an outer peripheral region of the sixth loop, and disposed to be aligned with a second side of the seventh sheet 330. The second end 332*b* of the sixth coil pattern 332 is disposed to be spaced apart from the second end 312*b* of the fourth coil pattern 312 and the second end 322*b* of the fifth coil pattern 322 by predetermined distances, and is exposed to the second side surface of the filter stack 110 to be connected to the fourth external electrode 150.

The second via hole V2 is disposed so as to be adjacent to the center of the seventh sheet 330 and to be spaced apart from the first end 332*a* of the sixth coil pattern 332. The second via hole V2 is formed to penetrate through the seventh sheet 330. An upper portion of the second via hole V2 is connected to the first end 312*a* of the fourth coil pattern 312 and the first end 322*a* of the fifth coil pattern 322. A lower portion of the second via hole V2 is connected to a third terminal pattern 342 formed in the eighth sheet 340, which will be described below.

Referring to FIG. 12, the third terminal pattern 342 and a fourth terminal pattern 344 for connecting coil patterns of a second electrode layer to external electrodes are formed in the eighth sheet 340.

The third terminal pattern 342 is placed on an upper surface of the eighth sheet 340. A first end 342*a* of the third terminal pattern 342 is disposed adjacent to a center of the eighth sheet 340. The first end 342*a* of the third terminal pattern 342 is connected to the first end 312*a* of the fourth coil pattern 312 and the first end 322*a* of the fifth coil pattern 322 through the second via hole V2.

A second end 342*b* of the third terminal pattern 342 is disposed to be aligned with a first side of the eighth sheet 340. Accordingly, the second end 342*b* of the third terminal pattern 342 is exposed to the first side surface of the filter stack 110, and connected to the second external electrode 130.

The fourth terminal pattern 344 is placed on the upper surface of the eighth sheet 340 so as to be spaced apart from the third terminal pattern 342. A first end 344*a* of the fourth terminal pattern 344 is connected to the first end 332*a* of the sixth coil pattern 332 through a via hole. A first end 344*a* of the fourth terminal pattern 344 is disposed adjacent to the center of the eighth sheet 340. The first end 344*a* of the fourth terminal pattern 344 is spaced apart from the first end 342*a* of the third terminal pattern 342 by a predetermined distance.

A second end 344*b* of the fourth terminal pattern 344 is disposed to be aligned with the first side of the eighth sheet 344. Accordingly, the second end 344*b* of the fourth terminal pattern 344 is spaced apart from the second end 342*b* of the third terminal pattern 342 by a predetermined distance, and is exposed to the first side surface of the filter stack 110 to be connected to the first external electrode 120 along with the second end 212*b* of the first terminal pattern 212.

The first stack 200 and the second stack 300 form a coil stack 400 that includes coils forming three channels.

The coil stack 400 is configured such that the first coil pattern 222, the second coil pattern 232, the third coil pattern 242, the fourth coil pattern 312, the fifth coil pattern 322, and the sixth coil pattern 332 are sequentially stacked.

Here, the first coil pattern 222 and the sixth coil pattern 332 form a first coil, which is a series inductor constituting the first channel. The second coil pattern 232 and the third coil pattern 242 form a second coil, which is a series inductor constituting the second channel. The fourth coil pattern 312 and the fifth coil pattern 322 form a third coil, which is a series inductor constituting the third channel.

Thus, the coil stack 400 forms a stack in which a coil pattern of the first channel, a coil pattern of the second channel, a coil pattern of the second channel, a coil pattern of the third channel, a coil pattern of the third channel, and a coil pattern of the first channel are sequentially disposed (stacked).

Accordingly, in the multilayer common mode filter 100 according to an embodiment of the present disclosure, a distance (spacing) between the coil patterns forming each channel may be kept constant, thereby enabling resistance and inductance of the coil patterns forming each channel to remain uniform.

Furthermore, the multilayer common mode filter 100 according to an embodiment of the present disclosure may minimize changes in inductance characteristics and common mode attenuation characteristics of the coil patterns by placing the terminal patterns for connection with the external electrodes in uppermost and lowermost portions of the coil stack 400. In the case where the terminal patterns are disposed in only one of the uppermost or lowermost portions, the inductance characteristics of each channel change, or the inductance characteristics of each coil pattern change, resulting in changes in the common mode attenuation characteristics.

In the multilayer common mode filter 100 according to an embodiment of the present disclosure, the terminal patterns are disposed in the uppermost and lowermost portions of the coil stack 400, the second coil pattern 232 and the third coil pattern 242 of the second channel are disposed between the first coil pattern 222 and the sixth coil pattern 332 of the first channel, and the fourth coil pattern 312 and the fifth coil pattern 322 of the third channel are disposed between the third coil pattern 242 and the sixth coil pattern 332. As a result, the number of via holes required for connecting the coil patterns may be minimized. The multilayer common mode filter 100 according to an embodiment of the present disclosure has two or fewer via holes formed in each sheet.

Referring to FIG. 13, the first coil pattern 222 and the sixth coil pattern 332 are respectively disposed in the upper and lower portions of the filter stack 110, thus forming the first channel. The second coil pattern 232 and the third coil pattern 242 are disposed (stacked) parallel to each other between the first coil pattern 222 and the sixth coil pattern 332, thus forming the second channel. The fourth coil pattern 312 and the fifth coil pattern 322 are disposed (stacked) parallel to each other between the third coil pattern 242 and the sixth coil pattern 332, thus forming the third channel.

Accordingly, the multilayer common mode filter 100 according to an embodiment of the present disclosure may be configured such that distances (spacing) between the first channel and the second channel, the second channel and the third channel, and the third channel and the first channel are maintained constant.

In addition, the multilayer common mode filter 100 according to an embodiment of the present disclosure can minimize changes in the inductance characteristics of the coil patterns by maintaining the constant distances (spacing) between the channels.

Furthermore, in the multilayer common mode filter 100 according to an embodiment of the present disclosure, since the terminal patterns that connect the coil patterns to the external electrodes are disposed in the uppermost and lowermost portions of the filter stack 110, the distances between the coil patterns and the terminal patterns can be made identical for all channels, thereby ensuring uniform resistance and inductance of the coil patterns that form each channel.

Additionally, the multilayer common mode filter 100 according to an embodiment of the present disclosure may enhance magnetic coupling (i.e., electromagnetic coupling) among the first to third coils and minimize the degradation of a differential signal.

The coil stack 110 is configured such that a plurality of via conductors, which are formed through the via holes provided to connect the coil patterns and the terminal patterns, are arranged without overlapping one another.

For example, referring to FIG. 14, a first via conductor 710 is formed through a via hole that connects the first terminal pattern 212 and the first coil pattern 222.

The second via conductor 720 is formed through a via hole that connects the fourth terminal pattern 344 and the sixth coil pattern 332, and is spaced apart from the first via conductor 710 without overlapping when viewed from the upper or lower surface of the coil stack 400 (i.e., in a top view of the coil stack 400).

A third via conductor 730 is formed through via holes that connect the second terminal pattern 214, the second coil pattern 232, and the third coil pattern 242, and is spaced apart from the first via conductor 710 and the second via conductor 720 without overlapping in the top view of the coil stack 400.

A fourth via conductor 740 is formed through via holes that connect the third terminal pattern 342, the fourth coil pattern 312, and the fifth coil pattern 322, and is spaced apart from the first to third via conductors 710 to 730 without overlapping in the top view of the coil stack 400.

In other terms, a first virtual line L1 is defined as a line that passes through both the upper and lower surfaces of the coil stack 400 and intersects a center of the first via conductor 710 in a vertical cross-sectional view of the coil stack 400.

A second virtual line L2 is defined as a line that passes through both the upper and lower surfaces of the coil stack 400 in the diagram and intersects a center of the second via conductor 720 in the vertical cross-sectional view of the coil stack 400. The second virtual line L2 is spaced apart from the first virtual line L1 by a predetermined distance and is parallel to the first virtual line L1.

A third virtual line L3 is defined as a line that passes through both the upper and lower surfaces of the coil stack 400 in the diagram and intersects a center of the third via conductor 730 in the vertical cross-sectional view of the coil stack 400. The third virtual line L3 is positioned between the first virtual line L1 and the second virtual line L2, spaced apart from the first virtual line L1 and the second virtual line L2 by a predetermined interval, and parallel to the first virtual line L1 and the second virtual line L2.

A fourth virtual line L4 is defined as a line that passes through both the upper and lower surfaces of the coil stack 400 and intersects a center of the fourth via conductor 740 in the drawing. The fourth virtual line L4 is positioned between the second virtual line L2 and the third virtual line L3, spaced apart from the second virtual line L2 and the third virtual line L3 by a predetermined interval, and parallel to the first to third virtual lines L1 to L3.

In another example, referring to FIG. 15, the coil stack 400 may be configured such that the first via conductor 710 and the second via conductor 720 are disposed between the third via conductor 730 and the fourth via conductor 740. In other words, the first virtual line L1 is disposed between the third virtual line L3 and the fourth virtual line L4, and the second virtual line L2 is disposed between the first virtual line L1 and the fourth virtual line L4. Here, the first virtual line L1 is parallel to the second virtual line L2 without overlapping.

As such, the multilayer common mode filter 100 according to an embodiment of the present disclosure can prevent pressure from being concentrated in regions, where via conductors are located, during a stacking process by dispersing pressure through distributed arrangement of the via conductors in a non-overlapping manner.

Furthermore, the multilayer common mode filter 100 according to an embodiment of the present disclosure can prevent cracks from being formed in a stack during the stacking process, as the pressure applied to the stack is dispersed during the stacking process through the distributed arrangement of the via conductors.

Moreover, the multilayer common mode filter 100 according to an embodiment of the present disclosure enables the prevention of short-circuit occurrence by avoiding electrode compression caused by pressure concentration, as the pressure applied to the stack during the stacking process is dispersed through the distributed arrangement of the via conductors.

Additionally, the multilayer common mode filter 100 according to an embodiment of the present disclosure enables flattening of the surface of the stack by preventing the formation of irregularities between a via conductor region and a surrounding region during the stacking process through the distributed arrangement of the via conductors.

In another example, referring to FIG. 16, the coil stack 400 may be configured such that the first via conductor 710 and the second via conductor 720 overlap each other. The third virtual line L3 and the fourth virtual line L4 are spaced apart from each other, and the first virtual line L1 and the second virtual line L2 are interposed between the third virtual line L3 and the fourth virtual line L4. Here, the first virtual line L1 and the second virtual line L2 are arranged to overlap between the third virtual line L3 and the fourth virtual line L4.

As such, the multilayer common mode filter 100 according to an embodiment of the present disclosure enables the prevention of cracks in the stack and the flattening of the surface of the stack by uniformly dispersing the pressure during the stacking process, as the first via conductor 710 and the second via conductor 720, which have a relatively thin first thickness, are overlapped, and the third via conductor 730 and the fourth via conductor 740, which have a relatively thick second thickness, are distributed.

In the coil stack 400, additional capacitance is formed by coupling of two adjacent via conductors. That is, in the coil stack 400, a first additional capacitance is formed between the first via conductor 710, which is connected to the first channel (i.e., the first coil), and the third via conductor 730, which is connected to the second channel (i.e., the second coil). A second additional capacitance is formed between the second via conductor 720, which is connected to the first channel (i.e., the first coil), and the fourth via conductor 730, which is connected to the third channel (i.e., the third coil).

In addition, the multilayer common mode filter 100 according to an embodiment of the present disclosure enables the adjustment (tuning) of the characteristics of the filter by adjusting the distances between the via conductors. The multilayer common mode filter 100 enables the adjustment of the characteristics of the filter by controlling at least one of a first distance, which is a distance between the first via conductor 710 and the third via conductor 730, and a second distance, which is a distance between the second via conductor 720 and the fourth via conductor 740.

The multilayer common mode filter 100 according to an embodiment of the present disclosure enables the improvement of both noise attenuation performance by reducing the first distance and/or the second distance and high-speed signal transmission characteristics by increasing the cut-off frequency through widening the first distance and/or the second distance.

The third stack 500 is disposed under the second stack 300. The third stack 500 is formed by stacking a plurality of sheets on which metal patterns are formed.

For example, referring to FIG. 17, the third stack 500 includes a ninth sheet 510, a tenth sheet 520 disposed under the ninth sheet 510, an eleventh sheet 530 disposed under the tenth sheet 520, a twelfth sheet 540 disposed under the eleventh sheet 530, and a thirteenth sheet 510 disposed under the twelfth sheet 540. Metal patterns 411 to 416 and 422 for forming capacitance are formed in the ninth sheet 510 and the tenth sheet 520. Metal pattern 432 and 442 for forming inductance are formed in the eleventh sheet 530 and the twelfth sheet 540. A metal pattern 452 for forming a ground is formed in the thirteenth sheet 510.

The ninth sheet 510 is disposed under the eighth sheet 340. A plurality of capacitor patterns are placed on an upper surface of the ninth sheet 510. The capacitor patterns may be configured as multiple patterns disposed on an input terminal and an output terminal of the multilayer common mode filter 100.

For example, referring to FIG. 18, the capacitor patterns include a first capacitor pattern 511, a second capacitor pattern 512, a third capacitor pattern 513, a fourth capacitor pattern 514, a fifth capacitor pattern 515, and a sixth capacitor pattern 516.

The first capacitor pattern 511 is placed on the upper surface of the ninth sheet 510.

A first end 511*a* of the first capacitor pattern 511 is disposed adjacent to a center of the ninth sheet 510.

A second end 511*b* of the first capacitor pattern 511 is disposed to be aligned with a first side of the ninth sheet 510. The first capacitor pattern 511 is exposed to the first side surface of the filter stack 110, and connected to the first external electrode 120.

The second capacitor pattern 512 is placed on the upper surface of the ninth sheet 510 so as to be spaced apart from the first capacitor pattern 511. The second capacitor pattern 512 is spaced apart from the first capacitor pattern 511, and is disposed to be biased toward a fourth side of the ninth sheet 510.

A first end 512*a* of the second capacitor pattern 512 is disposed adjacent to the center of the ninth sheet 510. A second end 512*b* of the second capacitor pattern 512 is disposed to be aligned with the first side of the ninth sheet 510. The second capacitor pattern 512 is exposed to the first side surface of the filter stack 110, and connected to the second external electrode 130.

The third capacitor pattern 513 is placed on the upper surface of the ninth sheet 510. The third capacitor pattern 513 is spaced apart from the first capacitor pattern 511 and the second capacitor pattern 512, and is disposed to be biased toward a third side of the ninth sheet 510. The third capacitor pattern 513 is disposed opposite to the second capacitor 512 with the first capacitor pattern 511 interposed therebetween.

A first end 513*a* of the third capacitor pattern 513 is disposed adjacent to the center of the ninth sheet 510. A second end 513*b* of the third capacitor pattern 513 is disposed to be aligned with the first side of the ninth sheet 510. The third capacitor pattern 513 is exposed to the first side surface of the filter stack 110, and connected to the third external electrode 140.

The fourth capacitor pattern 514 is placed on the upper surface of the ninth sheet 510.

A first end 514*a* of the fourth capacitor pattern 514 is disposed adjacent to the center of the ninth sheet 510. The first end 514*a* of the fourth capacitor pattern 514 faces the first end 511*a* of the first capacitor pattern 511.

A second end 514*b* of the fourth capacitor pattern 514 is disposed to be aligned with a second side of the ninth sheet 510. The fourth capacitor pattern 514 is exposed to the second side surface of the filter stack 110, and connected to the fourth external electrode 150.

The fifth capacitor pattern 515 is placed on the upper surface of the ninth sheet 510. The fifth capacitor pattern 515 is spaced apart from the fourth capacitor pattern 514, and is disposed to be biased toward the third side of the ninth sheet 510.

A first end 515*a* of the fifth capacitor pattern 515 is disposed adjacent to the center of the ninth sheet 510. The first end 515*a* of the fifth capacitor pattern 515 faces the first end 513*a* of the third capacitor pattern 513.

A second end 515*b* of the fifth capacitor pattern 515 is disposed to be aligned with the second side of the ninth sheet 510. The fifth capacitor pattern 515 is exposed to the second side surface of the filter stack 110, and connected to the fifth external electrode 160.

The sixth capacitor pattern 516 is placed on the upper surface of the ninth sheet 510. The sixth capacitor pattern 516 is spaced apart from the fourth capacitor pattern 514 and the fifth capacitor pattern 515, and is disposed to be biased toward the fourth side of the ninth sheet 510. The sixth capacitor pattern 516 is disposed opposite to the fifth capacitor pattern 515 with the fourth capacitor pattern 514 interposed therebetween.

A first end 516*a* of the sixth capacitor pattern 516 is disposed adjacent to the center of the ninth sheet 510. The first end 516*a* of the sixth capacitor pattern 516 faces the first end 512*a* of the second capacitor pattern 512.

A second end 516*b* of the sixth capacitor pattern 516 is disposed to be aligned with the second side of the ninth sheet 510. The sixth capacitor pattern 516 is exposed to the second side surface of the filter stack 110, and connected to the sixth external electrode 170.

It is assumed that the first to third external electrodes 120 to 140 disposed on the first side surface of the filter stack 110 serve as an input terminal of the multilayer common mode filter 100, and the third to sixth external electrodes 140 to 170 disposed on the second side surface of the filter stack 110 serve as an output terminal of the multilayer common mode filter 100.

The first to third capacitor patterns 511 to 513 are disposed on the first side surface of the filter stack 110 and are connected in a one-to-one manner to the first to third external electrodes 120 to 140, respectively. The fourth to sixth capacitor patterns 514 to 516 are disposed on the second side surface of the filter stack 110 and are connected in a one-to-one manner to the fourth to fifth external electrodes 150 to 160, respectively.

The filter stack 110 may include the ninth sheet 510 in which first to third capacitor patterns 511 to 513 connected to the input terminal are formed for adjusting and controlling capacitance characteristics, or the ninth sheet 510 in which fourth to sixth capacitor patterns 514 to 516 connected to the output terminal are formed.

The tenth sheet 520 is disposed under the ninth sheet 510. A floating pattern 522 for forming capacitance, along with the capacitor patterns of the ninth sheet 510, is placed on an upper surface of the tenth sheet 520.

Referring to FIG. 19, the floating pattern 522 is formed in a plate shape, and placed on the upper surface of the tenth sheet 520. The floating pattern 522 has a smaller area than the tenth sheet 520, and is disposed such that an outer periphery of the floating pattern 522 is spaced apart from four sides of the tenth sheet 520. The area of the floating pattern 522 is larger than the areas of a first inductor pattern 532 and a second inductor pattern 542, which will be described later, and is formed to be 90% or less of the area of the tenth sheet 520.

The floating pattern 522 overlaps the capacitor patterns of the ninth sheet 510 to form an overlapping region, where capacitance is formed.

The floating pattern 522 forms a first overlapping region 522*a* with the first capacitor pattern 511, and forms a first capacitance in the first overlapping region 522*a*. The floating pattern 522 forms a second overlapping region 522*b* with the second capacitor pattern 512, and forms a second capacitance in the second overlapping region 522*b*. The floating pattern 522 forms a third overlapping region 522*c* with the third capacitor pattern 513, and forms a third capacitance in the third overlapping region 522*c*. The floating pattern 522 forms a fourth overlapping region 522*d* with the fourth capacitor pattern 514, and forms a fourth capacitance in the fourth overlapping region 522*d*. The floating pattern 522 forms a fifth overlapping region 522*e* with the fifth capacitor pattern 515, and forms a fifth capacitance in the fifth overlapping region 522*e*. The floating pattern 522 forms a sixth overlapping region 522*f* with the sixth capacitor pattern 516, and forms a sixth capacitance in the sixth overlapping region 522*f*.

As such, the floating pattern 522 forms capacitance with the capacitor patterns. Accordingly, the multilayer common mode filter 100 can expand the attenuation band by forming an additional notch in the common mode attenuation characteristics. That is, the multilayer common mode filter 100 can realize broadband characteristics by forming an additional pole due to the floating pattern 522 and the capacitor patterns, along with the pole formed by the coil patterns of the filter stack 110.

The eleventh sheet 530 is disposed under the tenth sheet 520. The first inductor pattern 532 is placed on an upper surface of the eleventh sheet 530.

For example, referring to FIG. 20, the first inductor pattern 532 is wound on the upper surface of the eleventh sheet 530, thus forming a seventh loop. The first inductor pattern 532 is wound around a virtual winding axis passing through a center of the eleventh sheet 530 to form the seventh loop.

A first end 532*a* of the first inductor pattern 532 is disposed in an inner peripheral region of the seventh loop, and positioned at a center of the eleventh sheet 530. The first end 532*a* of the first inductor pattern 532 is connected to the floating pattern 522 of the tenth sheet through a via hole.

A second end 532*b* of the first inductor pattern 532 is disposed in an outer peripheral region of the seventh loop.

The twelfth sheet 540 is disposed under the eleventh sheet 530. The second inductor pattern 542 is placed on an upper surface of the twelfth sheet 540.

For example, referring to FIG. 21, the second inductor pattern 542 is wound on the upper surface of the twelfth sheet 540, thus forming an eighth loop. The second inductor pattern 542 is wound around a virtual winding axis passing through a center of the twelfth sheet 540 to form the eighth loop.

A first end 542*a* of the second inductor pattern 542 is disposed in an inner peripheral region of the eighth loop, and positioned at a center of the twelfth sheet 540. The first end 542*a* of the second inductor pattern 542 is connected to the ground pattern 552 of the thirteenth sheet 510 through a via hole passing through the twelfth sheet 540.

A second end 542*b* of the second inductor pattern 542 is disposed in an outer peripheral region of the eighth loop. The first end 542*b* of the second inductor pattern 542 is connected to the first inductor pattern 532 of the eleventh sheet 530 through a via hole. The second end 542*b* of the second inductor pattern 542 is connected to the second end 532*b* of the first inductor pattern 532 through a via hole.

As the second end 532*b* of the first inductor pattern 532 and the second end 542*b* of the second inductor pattern 542 are connected through the via hole, the first inductor pattern 532 and the second inductor pattern 542 constitute a parallel common inductor that forms a predetermined inductance.

Referring to FIG. 22, the lengths (areas) of the first inductor pattern 532 and the second inductor pattern 542 may vary depending on a required secondary resonant frequency.

As the lengths of the first inductor pattern 532 and the second inductor pattern 542 increase, the inductance value increases, and the secondary resonant frequency shifts to a lower frequency. As the lengths of the first inductor pattern 532 and the second inductor pattern 542 decrease, the inductance value decreases, and the secondary resonant frequency shifts to a higher frequency.

Accordingly, the lengths of the first inductor pattern 532 and the second inductor pattern 542 are determined based on the required secondary resonant frequency. The first inductor pattern 532 and the second inductor pattern 542 may be formed with the same length or with different lengths.

The thirteenth sheet 510 is disposed under the twelfth sheet 540. The ground pattern 552 is formed in the thirteenth sheet 510.

The ground pattern 552 is connected to the inductor patterns 532 and 542 and reduces the influence of stray capacitance formed between the multilayer common mode filter 100 and a printed circuit board.

For example, referring to FIG. 23, the ground pattern 552 is formed on an upper surface of the thirteenth sheet 510. The ground pattern 552 includes a first ground pattern 552*a*, a second ground pattern 552*b*, and a third ground pattern 552*c*.

The first ground pattern 552*a* is formed in a plate shape, and positioned at a center of the upper surface of the thirteenth sheet 510. The first ground pattern 552*a* has a smaller area than the thirteenth sheet 510, and is disposed such that an outer periphery of the first ground pattern 552*a* is spaced apart from four sides of the thirteenth sheet 510. The first ground pattern 552*a* is connected to the first end 542*a* of the second inductor pattern 542 through a via hole passing through the twelfth sheet 540.

The second ground pattern 552*b* extends from a third side of the first ground pattern 552*a* and is disposed to be aligned with a third side of the thirteenth sheet 510. A first end of the second ground pattern 552*b* is connected to the third side of the first ground pattern 552*a*. A second end of the second ground pattern 552*b* is disposed to be aligned with the third side of the thirteenth sheet 510, and is connected to the seventh external electrode 180.

The third ground pattern 552*c* extends from a fourth side of the first ground pattern 552*a* and is disposed to be aligned with a fourth side of the thirteenth sheet 510. A first end of the third ground pattern 552*c* is connected to the fourth side of the first ground pattern 552*a*. A second end of the third ground pattern 552*c* is disposed to be aligned with the fourth side of the thirteenth sheet 510, and is connected to the eighth external electrode 190.

Accordingly, the ground pattern 552 is exposed to third and fourth side surfaces of the filter stack 110, thus forming a ground connected to the seventh external electrode 180 and the eighth external electrode 190.

The first external electrode 120 is placed on the first side surface of the filter stack 110. Opposite ends of the first external electrode 120 may be formed to extend to upper and lower surfaces of the filter stack 110.

The first external electrode 120 is connected to the first terminal pattern 212, the fourth terminal pattern 344, and the first capacitor pattern 511 that are exposed to the first side surface of the filter stack 110. In this case, the first external electrode 120 is connected to the second end 212*b* of the first terminal pattern 212, the second end 344*b* of the fourth terminal pattern 344, and the second end 511*b* of the first capacitor pattern 511.

The second external electrode 130 is placed on the first side surface of the filter stack 110. The second external electrode 130 is disposed to be biased toward the fourth side surface of the filter stack 110, and is spaced apart from the first external electrode 120. Opposite ends of the second external electrode 130 may be formed to extend to the upper and lower surfaces of the filter stack 110.

The second external electrode 130 is connected to the third terminal pattern 342 and the second capacitor pattern 512 that are exposed to the first side surface of the filter stack 110. The second external electrode 130 is connected to the second end 342*b* of the third terminal pattern 342 and the second end 512*b* of the second capacitor pattern 512.

The third external electrode 140 is placed on the first side surface of the filter stack 110. The third external electrode 140 is disposed to be biased toward the third side surface of the filter stack 110, and is spaced apart from the first external electrode 120. The third external electrode 140 is opposite to the second external electrode 130 with the first external electrode 120 interposed therebetween. Opposite ends of the third external electrode 140 may be formed to extend to the upper and lower surfaces of the filter stack 110.

The third external electrode 140 is connected to the second terminal pattern 214 and the third capacitor pattern 513 that are exposed to the first side surface of the filter stack 110. The third external electrode 140 is connected to the second end 214*b* of the second terminal pattern 214 and the second end 513*b* of the third capacitor pattern 513.

The fourth external electrode 150 is placed on the second side surface of the filter stack 110. The fourth external electrode 150 is opposite to the first external electrode 120 with the filter stack 110 interposed therebetween, and is disposed to face the first external electrode 120. Opposite ends of the fourth external electrode 150 may be formed to extend to the upper and lower surfaces of the filter stack 110.

The fourth external electrode 150 is connected to the first coil pattern 222, the sixth coil pattern 332, and the fourth capacitor pattern 514 that are exposed to the second side surface of the filter stack 110. The fourth external electrode 150 is connected to the second end 222*b* of the first coil pattern 222, the second end 332*b* of the sixth coil pattern 332, and the second end 514*b* of the fourth capacitor pattern 514.

The fifth external electrode 160 is placed on the second side surface of the filter stack 110. The fifth external electrode 160 is opposite to the third external electrode 140 with the filter stack 110 interposed therebetween, and is disposed to face the third external electrode 140. The fifth external electrode 160 is disposed to be biased toward the third side surface of the filter stack 110, and is spaced apart from the fourth external electrode 150. Opposite ends of the fifth external electrode 160 may be formed to extend to the upper and lower surfaces of the filter stack 110.

The fifth external electrode 160 is connected to the second coil pattern 232, the third coil pattern 242, and the fifth capacitor pattern 515 that are exposed to the second side surface of the filter stack 110. The fifth external electrode 160 is connected to the second end 232*b* of the second coil pattern 232, the second end 242*b* of the third coil pattern 242, and the second end 515*b* of the fifth capacitor pattern 515.

The sixth external electrode 170 is placed on the second side surface of the filter stack 110. The sixth external electrode 170 is opposite to the second external electrode 130 with the filter stack 110 interposed therebetween, and is disposed to face the second external electrode 130. The sixth external electrode 170 is disposed to be biased toward the fourth side surface of the filter stack 110, and is spaced apart from the fourth external electrode 150. The sixth external electrode 170 is opposite to the fifth external electrode 160 with the fourth external electrode 150 interposed therebetween. Opposite ends of the sixth external electrode 170 may be formed to extend to the upper and lower surfaces of the filter stack 110.

The sixth external electrode 170 is connected to the fourth coil pattern 312, the fifth coil pattern 322, and the sixth capacitor pattern 516 that are exposed to the second side surface of the filter stack 110. The sixth external electrode 170 is connected to the second end 312*b* of the fourth coil pattern 312, the second end 322*b* of the fifth coil pattern 322, and the second end 516*b* of the sixth capacitor pattern 516.

The seventh external electrode 180 is placed on the third side surface of the filter stack 110. The seventh external electrode 180 is connected to the ground pattern 552 exposed to the third side surface of the filter stack 110. The seventh external electrode 180 is connected to the second end of the second ground pattern 552*b* exposed to the third side surface of the filter stack 110. Opposite ends of the seventh external electrode 180 may be formed to extend to the upper and lower surfaces of the filter stack 110.

The eighth external electrode 190 is placed on the fourth side surface of the filter stack 110. The eighth external electrode 190 is opposite to the eighth external electrode 180 with the filter stack 110 interposed therebetween. The eighth external electrode 190 is connected to the ground pattern 552 exposed to the third side surface of the filter stack 110. The eighth external electrode 190 is connected to the second end of the third ground pattern 552*c* exposed to the fourth side surface of the filter stack 110. Opposite ends of the eighth external electrode 190 may be formed to extend to the upper and lower surfaces of the filter stack 110.

The first external electrode 120 and the fourth external electrode 150 function as an input terminal and an output terminal of the first channel, which is formed by the first coil pattern 222 and the sixth coil pattern 332. The third external electrode 140 and the fifth external electrode 160 function as an input terminal and an output terminal of the second channel, which is formed by the second coil pattern 232 and the third coil pattern 242. The second external electrode 130 and the sixth external electrode 170 function as an input terminal and an output terminal of the third channel, which is formed by the fourth coil pattern 312 and the fifth coil pattern 322. The seventh external electrode 180 and the eighth external electrode 190 are connected to the ground pattern 552, thus functioning as a ground terminal.

Referring to FIG. 24 illustrating an equivalent circuit of the multilayer common mode filter 100 according to an embodiment of the present disclosure, capacitance is formed between the first coil and the second coil, between the second coil and the third coil, and between the first coil and the third coil.

The filter stack 110 is formed in such a way that the coil stack 400 is formed by stacking the first stack 20 and the second stack 300 on which the coil patterns are formed, and the third stack 500, which includes the capacitor patterns, the floating pattern 522, and the inductor patterns 532 and 542, is placed under the coil stack 400. Accordingly, the capacitor patterns connected between the coils of the respective channel and the external electrodes are interconnected, and a coupling effect is induced between the capacitor patterns and the floating pattern 522. As a result, additional capacitances C1 to C6 are formed between the coils of the respective channels and the external electrodes due to the capacitor patterns and the floating pattern 522.

Consequently, the multilayer common mode filter 100 according to an embodiment of the present disclosure can have increased capacitance without the need to add an electrode layer including a coil pattern or increase the area of the coil patterns, thereby achieving greater capacitance than a prior multilayer common mode filter 10 while maintaining the same size.

Furthermore, in the multilayer common mode filter 100 according to an embodiment of the present disclosure, as additional capacitance is formed by the capacitor pattern and the floating pattern 522, an additional notch can be formed in the common mode attenuation characteristics, thereby expanding the attenuation band.

The first inductor pattern 532 and the second inductor pattern 542 form a single inductor. Opposite ends of the inductor 532 and 542 formed by the first inductor pattern 532 and the second inductor pattern 542 are respectively connected to the floating pattern 522 and the ground pattern 552, and form a short path circuit between the floating pattern 522 and the ground pattern 552.

The inductance of the inductor 532 and 542, which is formed by the first inductor pattern 532 and the second inductor pattern 542, can be defined by the lengths of the first inductor pattern 532 and the second inductor pattern 542. The inductance of the inductor 532 and 542, which is formed by the first inductor pattern 532 and the second inductor pattern 542, is a dominant factor in adjusting and controlling the secondary resonant frequency of the multilayer common mode filter 100.

A primary resonant frequency is determined by the capacitance formed between the first coil, the second coil, and the third coil. The secondary resonant frequency is determined by the capacitor patterns 511 to 516, the floating pattern 522, and the inductor patterns 532 and 542.

Here, the inductor patterns 532 and 542 have a relatively higher inductance value compared to the capacitance formed between the capacitor patterns 511 to 516 and the floating pattern 522, thus serving as a dominant factor in determining the secondary resonant frequency.

The inductor patterns 532 and 542 have, within the same area, a value adjustment range allowing the secondary resonant frequency to be adjusted to various values, and can improve design flexibility due to having a smaller area compared to the capacitor patterns 511 to 516. The capacitor patterns 511 to 516 and the floating pattern 522 form a relatively small capacitance compared to the inductor patterns 532 and 542, thereby reducing loss during signal transmission.

As such, the inductor patterns 532 and 542 serve as the dominant factor in determining the secondary resonant frequency and can reduce the influence of parasitic inductance (parasitic L) that varies depending on the mounting orientation of a chip, thereby preventing characteristic deviations due to the mounting orientation.

Referring to FIG. 25, it is assumed that a first multilayer common mode filter 100*a* has the first inductor pattern 532 and the second inductor pattern 542 that are formed with a first length, a second multilayer common mode filter 100*b* has the first inductor pattern 532 and the second inductor pattern 542 that are formed with a second length, and a third multilayer common mode filter 100*c* has the first inductor pattern 532 and the second inductor pattern 542 that are formed with a third length. The first length is shorter than the second length, and the second length is shorter than the third length.

Referring to FIG. 26, based on a common mode, the first multilayer common mode filter 100*a* (A), the second multilayer common mode filter 100*b* (B), and the third multilayer common mode filter 100*c* (C) form first resonant frequencies RF1 at approximately 2.45 GHz. The first resonant frequencies RF1 of the first to third multilayer common mode filters 100*a* (A) to 100*c* (C) can be regarded as the same within the margin of error.

On the other hand, the first to third multilayer common mode filters 100*a* to 100*c* form different second resonant frequencies RF2-1 to RF2-3 in the common mode. In other words, the first multilayer common mode filter 100*a* (refer to A) forms the second resonant frequency RF2-1 at approximately 4.8 GHz, the second multilayer common mode filter 100*b* (refer to B) forms the second resonant frequency RF2-2 at approximately 4.5 GHz, and the third multilayer common mode filter 100*c* (refer to C) forms the second resonant frequency RF2-3 at approximately 4.2 GHz.

That is, as the lengths of the inductor patterns (i.e., the first inductor pattern 532 and the second inductor pattern 542) increase, the inductance increase, and the second resonant frequency of the multilayer common mode filter 100 shifts toward a lower frequency. As the lengths of the inductor patterns (i.e., the first inductor pattern 532 and the second inductor pattern 542) decrease, the inductance decreases, and the second resonant frequency of the multilayer common mode filter 100 shifts toward a higher frequency.

Referring to FIG. 27, based on a differential mode, the first to third multilayer common mode filters 100*a* to 100*c* exhibit cutoff at approximately 7.1 GHz, 7.2 GHz, 7.37 GHz, and 7.53 GHz. The cutoff frequencies of the first to third multilayer common mode filters 100*a* to 100*c* can be regarded as the same within the margin of error.

Accordingly, it can be understood that the lengths of the inductor patterns 532 and 542 serve as a dominant factor in adjusting (controlling) the second resonant frequency of the multilayer common mode filter 100. The second resonant frequency characteristics of the multilayer common mode filter 100 can be modified by adjusting the length of the first inductor pattern 532 and/or the length of the second inductor pattern 542.

Furthermore, in the multilayer common mode filter 100 according to an embodiment of the present disclosure, a short path circuit is formed by placing (arranging) the third stack 500, which includes the inductor patterns 532 and 542, under the coil stack 400, thereby allowing the second resonant frequency to be readily adjusted/controlled by adjusting the lengths of the inductor patterns 532 and 542.

Referring to FIG. 28, the filter stack 110 may further include a first magnetic sheet 620 disposed on an upper portion of the first stack 200, and a second magnetic sheet 640 interposed between the second stack 300 and the third stack 500. Here, as an example, the first magnetic sheet 620 and the second magnetic sheet 640 are sheets formed of magnetic material such as ferrite.

Referring to FIG. 29, the filter stack 110 may further include a third magnetic sheet 660 disposed under the third stack 500. Here, as an example, the third magnetic sheet 660 is a sheet formed of magnetic material such as ferrite. The ferrite may include Ni—Zn or Mn—Zn.

The third magnetic sheet 660 can increase parallel inductance induced by the inductor patterns 532 and 542. The addition of the third magnetic sheet 660 to the lowermost portion in the same multilayer structure enables the multilayer common mode filter 100 to have a lower secondary resonant frequency.

In the multilayer common mode filter 100 according to an embodiment of the present disclosure, the interval between the first resonant frequency and the second resonant frequency can be adjusted depending on the presence or absence of the third magnetic sheet 660, which is disposed in the lowermost portion of the filter stack 110. Here, placing the third magnetic sheet 660 can reduce the interval (or result in a narrower interval) between the first resonant frequency and the second resonant frequency in the multilayer common mode filter 100.

Referring to FIG. 30, a first multilayer common mode filter 100*a* does not include the third magnetic sheet 660, and the inductor patterns 532 and 542 are formed with a first length. A second multilayer common mode filter 100*b* does not include the third magnetic sheet 660, and the inductor patterns 532 and 542 are formed with a second length, which is longer than the first length. A third multilayer common mode filter 100*c* includes the third magnetic sheet 660, and the inductor patterns 532 and 542 are formed with the first length. A fourth multilayer common mode filter 100 includes the third magnetic sheet 660, and the inductor patterns 532 and 542 are formed with the second length, which is longer than the first length.

Referring to FIG. 31, the first multilayer common mode filter 100*a* has a first resonant frequency of approximately 2.35 GHz and a second resonant frequency of approximately 4.97 GHz. The second multilayer common mode filter 100*b* has a first resonant frequency of approximately 2.38 GHz and a second resonant frequency of approximately 4.37 GHz. The third multilayer common mode filter 100*c* has a first resonant frequency of approximately 2.45 GHz and a second resonant frequency of approximately 4.8 GHz. The fourth multilayer common mode filter 100 has a first resonant frequency of approximately 2.50 GHz and a second resonant frequency of approximately 4.21 GHz.

An interval G1 between the first resonant frequency and the second resonant frequency of the first multilayer common mode filter 100*a* is approximately 2.62 GHz. An interval G2 between the first resonant frequency and the second resonant frequency of the second multilayer common mode filter 100*b* is approximately 1.99 GHz. An interval G3 between the first resonant frequency and the second resonant frequency of the third multilayer common mode filter 100*c* is approximately 2.35 GHz. An interval G4 between the first resonant frequency and the second resonant frequency of the fourth multilayer common mode filter 100 is approximately 1.71 GHz.

Comparing the first multilayer common mode filter 100*a* and the third multilayer common mode filter 100*c*, which have the same length of inductor patterns 532 and 542, the interval G3 of the third multilayer common mode filter 100*c*, which includes the third magnetic sheet 660, decreases by approximately 0.27 GHz compared to the interval G1 of the first multilayer common mode filter 100*a*, which does not include the third magnetic sheet 660.

Comparing the second multilayer common mode filter 100*b* and the fourth multilayer common mode filter 100, which have the same length of inductor patterns 532 and 542, the interval G4 of the fourth multilayer common mode filter 100, which includes the third magnetic sheet 660, decreases by approximately 0.28 GHz compared to the interval G2 of the second multilayer common mode filter 100*b*, which does not include the third magnetic sheet 660.

Accordingly, in the multilayer common mode filter 100 according to an embodiment of the present disclosure, the interval between the first resonant frequency and the second resonant frequency can be adjusted (controlled) by using the third magnetic sheet 660, which is disposed in the lowermost portion of the filter stack 110.

Referring to FIG. 32, unlike the prior multilayer common mode filter having a structure in which a coil stack 12 and a capacitor stack 13 are stacked (i.e., an LC filter structure), the multilayer common mode filter 100 according to an embodiment of the present disclosure has a structure in which the third stack 500, in which a capacitor and an inductor are stacked, is placed under the coil stack 400 (i.e., an LPF filter structure). As a result, the multilayer common mode filter 100 according to an embodiment of the present disclosure exhibits improved attenuation characteristics in the common mode and enhanced characteristics in terms of insertion loss and cutoff in the differential mode compared to the prior multilayer common mode filter 10.

Referring to FIG. 33, the prior multilayer common mode filter (refer to C) forms three resonant frequencies, with a first resonant frequency formed at approximately 2.5 GHz, a second resonant frequency formed at approximately 5.2 GHz, and a third resonant frequency formed at approximately 7.3 GHz.

The multilayer common mode filter 100 (refer to D) according to an embodiment of the present disclosure forms two resonant frequencies, with a first resonant frequency formed at approximately 2.5 GHz and a second resonant frequency formed at approximately 5.5 GHz.

As such, the multilayer common mode filter 100 according to an embodiment of the present disclosure has attenuation performance concentrated only in the common mode attenuation band (i.e., a target band), indicating that the attenuation characteristics in the common mode are improved compared to the prior multilayer common mode filter 10.

Referring to FIG. 34, the multilayer common mode filter 100 (refer to E) according to an embodiment of the present disclosure exhibits improved low-frequency cutoff characteristics and reduced ripple in the differential mode, compared to the prior multilayer common mode filter (refer to F).

The above description is merely a description of the technical spirit of the present disclosure, and those skilled in the art may change and modify the present disclosure in various ways without departing from the essential characteristic of the present disclosure. Accordingly, the embodiments described in the present disclosure should not be construed as limiting the technical spirit of the present disclosure, but should be construed as describing the technical spirit of the present disclosure. The technical spirit of the present disclosure is not restricted by the embodiments. The range of protection of the present disclosure should be construed based on the following claims, and all of technical spirits within an equivalent range of the present disclosure should be construed as being included in the scope of rights of the present disclosure.

The invention claimed is:

1. A multilayer common mode filter comprising:

a first stack provided with a first coil pattern, a second coil pattern, and a third coil pattern; and a second stack provided with a fourth coil pattern, a fifth coil pattern, and a sixth coil pattern, and disposed under the first stack to form a coil stack along with the first stack, wherein the coil stack comprises:

a first via conductor connected to the first coil pattern in the first stack;

a second via conductor connected to the sixth coil pattern in the second stack;

a third via conductor connected to the second coil pattern and the third coil pattern in the first stack; and a fourth via conductor connected to the fourth coil pattern and the fifth coil pattern in the second stack, wherein in a top view of the coil stack, the fourth via conductor is disposed at a position that does not overlap the first via conductor, the second via conductor, and the third via conductor, wherein in a vertical sectional view of the coil stack, the first via conductor is spaced apart from the second via conductor, the third via conductor and the fourth via conductor are spaced apart from each other between the first via conductor and the second via conductor, and the third via conductor is interposed between the first via conductor and the fourth via conductor.

2. The multilayer common mode filter of claim 1, wherein the first stack further comprises a first terminal pattern and a second terminal pattern, wherein the second stack further comprises a third terminal pattern and a fourth terminal pattern, wherein the first via conductor connects the first coil pattern to the first terminal pattern in the first stack, wherein the second via conductor connects the sixth coil pattern to the fourth terminal pattern in the second stack, wherein the third via conductor connects the second coil pattern and the third coil pattern to the second terminal pattern in the first stack, and wherein the fourth via conductor connects the fourth coil pattern and the fifth coil pattern to the third terminal pattern in the second stack.

3. The multilayer common mode filter of claim 1, wherein in the top view of the coil stack, the third via conductor is disposed at a position that does not overlap the first via conductor and the second via conductor.

4. The multilayer common mode filter of claim 3, wherein in the top view of the coil stack, the first via conductor is disposed at a position that does not overlap the second via conductor.

5. The multilayer common mode filter of claim 3, wherein in the top view of the coil stack, the first via conductor is disposed at a position that overlaps the second via conductor.

6. The multilayer common mode filter of claim 1, further comprising a third stack provided with a plurality of capacitor patterns, a floating pattern, an inductor pattern, and a ground pattern, and disposed under the second stack.

7. The multilayer common mode filter of claim 6, wherein the third stack comprises:

the plurality of capacitor patterns disposed under the second stack;

the floating pattern disposed under the plurality of capacitor patterns, and configured to form additional capacitance by overlapping the plurality of capacitor patterns;

the ground pattern disposed under the floating pattern; and the inductor pattern disposed between the floating pattern and the ground pattern, wherein a first end of the inductor pattern is connected to the floating pattern, and a second end of the inductor pattern is connected to the ground pattern.

8. The multilayer common mode filter of claim 6, wherein the third stack comprises:

a ninth sheet;

the plurality of capacitor patterns placed on a first surface of the ninth sheet and spaced apart from each other;

a tenth sheet disposed under the ninth sheet; and the floating pattern placed on a first surface of the tenth sheet, and forming a plurality of overlapping areas by overlapping the plurality of capacitor patterns, the floating pattern being configured to form additional capacitance in the plurality of overlapping regions.

9. The multilayer common mode filter of claim 8, wherein the third stack further comprises:

the ground pattern disposed under the tenth sheet; and the inductor pattern interposed between the tenth sheet and the ground pattern, and including a first end connected to the floating pattern, and a second end connected to the ground pattern.

10. The multilayer common mode filter of claim 9, wherein the third stack further comprises:

an eleventh sheet interposed between the tenth sheet and the ground pattern; and a twelfth sheet interposed between the eleventh sheet and the ground pattern, wherein the inductor pattern comprises:

a first inductor pattern placed on a first surface of the eleventh sheet, and including a first end connected to the floating pattern through a via hole passing through the tenth sheet, and a second end spaced apart from the first end; and a second inductor pattern placed on a first surface of the twelfth sheet, and including a first end connected to the ground pattern, and a second end connected to the second end of the first inductor pattern through a via hole passing through the eleventh sheet.

11. The multilayer common mode filter of claim 6, further comprising a first magnetic sheet disposed over the first stack; and a second magnetic sheet interposed between the second stack and the third stack.

12. The multilayer common mode filter of claim 11, further comprising a third magnetic sheet disposed under the third stack.

13. The multilayer common mode filter of claim 6, wherein a filter stack formed by stacking the first stack, the second stack, and the third stack has a first resonant frequency, and a second resonant frequency higher than the first resonant frequency, and wherein the second resonant frequency shifts to a higher frequency as a length of the inductor pattern increases.

14. The multilayer common mode filter of claim 6, wherein a filter stack formed by stacking the first stack, the second stack, and the third stack has a first resonant frequency, and a second resonant frequency higher than the first resonant frequency, and wherein the second resonant frequency shifts to a lower frequency as a length of the inductor pattern decreases.

15. The multilayer common mode filter of claim 6, wherein a filter stack formed by stacking the first stack, the second stack, and the third stack includes a first side surface, a second side surface opposite to the first side surface, a third side surface, and a fourth side surface opposite to the third side surface, the multilayer common mode filter further comprising:

a first external electrode disposed on the first side surface, and connected to a second end of a first terminal pattern, a second end of a fourth terminal pattern, and a second end of a first capacitor pattern that are exposed to the first side surface;

a second external electrode disposed on the first side surface, and connected to a second end of a third terminal pattern and a second end of a second capacitor pattern that are exposed to the first side surface;

a third external electrode disposed on the first side surface, and connected to a second end of a second terminal pattern and a second end of a third capacitor pattern that are exposed to the first side surface;

a fourth external electrode disposed on the second side surface, and connected to a second end of the first coil pattern, a second end of the sixth coil pattern, and a second end of a fourth capacitor pattern that are exposed to the second side surface;

a fifth external electrode disposed on the second side surface, and connected to a second end of the second coil pattern, a second end of the third coil pattern, and a second end of a fifth capacitor pattern that are exposed to the second side surface; and a sixth external electrode disposed on the second side surface, and connected to a second end of the fourth coil pattern, a second end of the fifth coil pattern, and a second end of a sixth capacitor pattern that are exposed to the second side surface.

16. The multilayer common mode filter of claim 15, further comprising:

a seventh external electrode disposed on the third surface, and connected to a first end of a ground pattern that is exposed to the third side surface; and an eighth external electrode disposed on the fourth side surface, and connected to a second end of the ground pattern that is exposed to the fourth side surface.

17. The multilayer common mode filter of claim 1, wherein the coil stack is configured such that the first coil pattern, the second coil pattern, the third coil pattern, the fourth coil pattern, the fifth coil pattern, and the sixth coil pattern are sequentially stacked, wherein the first coil pattern and the sixth coil pattern form a first coil that forms a first channel, wherein the second coil pattern and the third coil pattern are interposed between the first coil pattern and the sixth coil pattern, and form a second coil that forms a second channel, and wherein the fourth coil pattern and the fifth coil pattern are interposed between the third coil pattern and the sixth coil pattern, and form a third coil that forms a third channel.

18. A multilayer common mode filter comprising:

a first stack provided with a first coil pattern, a second coil pattern, and a third coil pattern; and a second stack provided with a fourth coil pattern, a fifth coil pattern, and a sixth coil pattern, and disposed under the first stack to form a coil stack along with the first stack, wherein the coil stack comprises:

a first via conductor connected to the first coil pattern in the first stack;

a second via conductor connected to the sixth coil pattern in the second stack;

a third via conductor connected to the second coil pattern and the third coil pattern in the first stack; and a fourth via conductor connected to the fourth coil pattern and the fifth coil pattern in the second stack, wherein in a top view of the coil stack, the fourth via conductor is disposed at a position that does not overlap the first via conductor, the second via conductor, and the third via conductor, wherein in a vertical sectional view of the coil stack, the third via conductor is spaced apart from the fourth via conductor, the first via conductor and the second via conductor are spaced apart from each other between the third via conductor and the fourth via conductor, and the first via conductor is interposed between the second via conductor and the third via conductor.

19. A multilayer common mode filter comprising:

a first stack provided with a first coil pattern, a second coil pattern, and a third coil pattern; and a second stack provided with a fourth coil pattern, a fifth coil pattern, and a sixth coil pattern, and disposed under the first stack to form a coil stack along with the first stack, wherein the coil stack comprises:

a first via conductor connected to the first coil pattern in the first stack;

a second via conductor connected to the sixth coil pattern in the second stack;

a third via conductor connected to the second coil pattern and the third coil pattern in the first stack; and a fourth via conductor connected to the fourth coil pattern and the fifth coil pattern in the second stack, wherein in a top view of the coil stack, the fourth via conductor is disposed at a position that does not overlap the first via conductor, the second via conductor, and the third via conductor, wherein in a vertical sectional view of the coil stack, the third via conductor is spaced apart from the fourth via conductor, the first via conductor and the second via conductor are interposed between the third via conductor and the fourth via conductor, and are disposed to overlap in the top view of the coil stack.

* * * * *